(12) United States Patent
Hoh et al.

(10) Patent No.: US 12,344,264 B2
(45) Date of Patent: Jul. 1, 2025

(54) GENERATING AND DEPICTING A GRAPHIC OF A PHANTOM VEHICLE

(71) Applicants: Toyota Jidosha Kabushiki Kaisha, Toyota (JP); Toyota Motor Engineering & Manufacturing North America, Inc., Plano, TX (US)

(72) Inventors: Baik Hoh, Mountain View, CA (US); Seyhan Ucar, Mountain View, CA (US); Emrah A. Sisbot, Mountain View, CA (US); Kentaro Oguchi, Mountain View, CA (US)

( * ) Notice: Subject to any disclaimer, the term of this patent is extended or adjusted under 35 U.S.C. 154(b) by 399 days.

(21) Appl. No.: 17/725,161

(22) Filed: Apr. 20, 2022

(65) Prior Publication Data

US 2023/0339492 A1    Oct. 26, 2023

(51) Int. Cl.
| | |
|---|---|
| *B60W 50/14* | (2020.01) |
| *B60K 35/00* | (2006.01) |
| *G06F 30/20* | (2020.01) |
| *B60K 35/23* | (2024.01) |
| *B60K 35/28* | (2024.01) |
| *B60W 60/00* | (2020.01) |

(52) U.S. Cl.
CPC .......... *B60W 50/14* (2013.01); *B60K 35/00* (2013.01); *G06F 30/20* (2020.01); *B60K 35/23* (2024.01); *B60K 35/28* (2024.01); *B60K 2360/164* (2024.01); *B60K 2360/171* (2024.01); *B60K 2360/176* (2024.01); *B60W 2050/146* (2013.01); *B60W 60/0027* (2020.02); *B60W 2554/4046* (2020.02)

(58) Field of Classification Search
CPC ............ B60W 50/14; B60W 60/0027; B60W 2050/146; B60W 2554/4046; B60K 35/00; B60K 35/23; B60K 35/28; B60K 2360/164; B60K 2360/171; B60K 2360/176; G06F 30/20
See application file for complete search history.

(56) References Cited

U.S. PATENT DOCUMENTS

| | | | |
|---|---|---|---|
| 8,332,142 | B2 | 12/2012 | Tanaka |
| 8,384,531 | B2 | 2/2013 | Szczerba et al. |
| 8,593,519 | B2 | 11/2013 | Tauchi et al. |
| 10,239,527 | B2 | 3/2019 | Hada |
| 10,410,514 | B2 | 9/2019 | Shimizu |

(Continued)

*Primary Examiner* — Yuen Wong
(74) *Attorney, Agent, or Firm* — Burbage Law, P.C.; Jon-Michael Burbage

(57) ABSTRACT

The disclosure includes embodiments for a phantom system. A method according to some embodiments is executed by an onboard vehicle computer. The method includes generating a model of a driving behavior of a target vehicle based on sensor data describing the driving behavior and a roadway environment. The method also includes determining a graphic of a phantom vehicle based on the model. The method also includes causing an electronic display of an ego vehicle to depict the graphic as an element of a graphical user interface that depicts the graphic and an image of a remote vehicle that is following the ego vehicle. For example, the method includes generating graphical data describing the graphical user interface including the graphic and the image and providing the graphical data to the electronic display to cause the electronic display to depict the graphical user interface including the graphic and the image.

20 Claims, 5 Drawing Sheets

(56) References Cited

U.S. PATENT DOCUMENTS

| | | |
|---|---|---|
| 10,744,877 B2 | 8/2020 | Kochiya |
| 11,021,105 B2 | 6/2021 | Arase |
| 11,074,813 B2 | 7/2021 | Julian et al. |
| 2022/0343038 A1* | 10/2022 | Zhu .................. G06F 30/20 |

* cited by examiner

GENERATING AND DEPICTING A GRAPHIC OF A PHANTOM VEHICLE

BACKGROUND

The specification relates to generating and depicting a graphic of a phantom vehicle. More specifically, some embodiments relate to generating and depicting a graphic of a phantom vehicle to inform a driver of an ego vehicle about roadway conditions (e.g., their own driving behavior or the driving behavior of a remote vehicle that is following the ego vehicle).

Modern vehicles broadcast vehicle-to-everything (V2X) messages that include digital data describing their locations, speeds, headings, past actions, and future actions, etc. Vehicles that broadcast V2X messages are referred to as "V2X transmitters." Vehicles that receive the V2X messages are referred to as "V2X receivers." The digital data that is included in the V2X messages can be used for various purposes including, for example, the proper operation of Advanced Driver Assistance Systems (ADAS systems) or autonomous driving systems which are included in the V2X receivers.

Modern vehicles include ADAS systems or automated driving systems. An automated driving system is a collection of ADAS systems which provides sufficient driver assistance that a vehicle is autonomous. ADAS systems and automated driving systems are referred to as "vehicle control systems." Other types of vehicle control systems are possible. A vehicle control system includes code and routines, and optionally hardware, which are operable to control the operation of some or all of the systems of a vehicle.

A particular vehicle that includes these vehicle applications is referred to herein as an "ego vehicle" and other vehicles in the vicinity of the ego vehicle are referred to as "remote vehicles."

SUMMARY

Drivers of vehicles can be assisted to drive better and avoid others who are driving poorly. Described herein are embodiments of a phantom system, method, and a computer program product. See, for example, the phantom system illustrated in FIGS. 1 and 2. In some embodiments, the phantom system is an ADAS system that assists a driver of a vehicle that includes the phantom system to do one or more of the following: monitor their own driving; understand when they are driving poorly; understand changes they can make so that they are driving better; and monitor their driving after they make changes to confirm that they are driving better.

In some embodiments, the phantom system is an ADAS system that assists a driver of a vehicle that includes the phantom system to do one or more of the following: monitor the driving of a vehicle that is following them; understand when the driver of the following vehicle is driving poorly; understand changes they can to their own driving so that they do not drive like the driver of the following vehicle; monitor their own driving after they make changes to confirm that they are driving better; and make changes to their own present driving pattern (e.g., speed, lane of travel, etc.) to avoid driving proximate to the following vehicle that was identified as driving poorly.

In some embodiments, the phantom system beneficially generates a graphic of a phantom vehicle. In some embodiments, the phantom system is an element of an ego vehicle. The phantom vehicle mimics the behavior of the ego vehicle. The ego vehicle is being operated in a safer manner (e.g., the driving behavior of the ego vehicle satisfies a threshold for safety). The phantom vehicle is depicted as a graphical element with a graphical user interface (GUI) that includes visual representations of other vehicles. The driver of the ego vehicle is presented with the GUI. The GUI gives the driver a visual cue that helps them be aware of the driving behavior of other vehicles on the roadway proximate to the ego vehicle. For example, if another vehicle is driving similar to the driving behavior of a distracted driver (e.g., the driving behavior of the other vehicle satisfies a threshold for distraction), then the GUI makes the driver of the ego vehicle aware of this circumstance. Other examples are possible.

For example, the other driver may be driving safely, timidly, or aggressively (e.g., the driving behavior of the ego vehicle satisfies a threshold for safety, timidity, or aggression, respectively), and the GUI makes the driver of the ego vehicle aware of this circumstances.

The phantom system is configured to display the GUI on an electronic display device. The electronic display device includes any electronic display device that is communicatively coupled to the phantom system and configured to receive GUI data from the phantom system, generate one or more GUIs based on the GUI data, and display the GUIs on the electronical display device.

Accordingly, a phantom vehicle includes a graphical representation of a vehicle such as the ego vehicle or some other vehicle. The graphical representation can be included as a graphical element of a GUI.

A system of one or more computers can be configured to perform particular operations or actions by virtue of having software, firmware, hardware, or a combination of them installed on the system that in operation causes or cause the system to perform the actions. One or more computer programs can be configured to perform particular operations or actions by virtue of including instructions that, when executed by data processing apparatus, cause the apparatus to perform the actions.

One general aspect includes: generating, by a processor, a model of a driving behavior of a target vehicle based on sensor data describing the driving behavior and a roadway environment; determining a graphic of a phantom vehicle based on the model, and causing an electronic display of an ego vehicle to depict the graphic as an element of a graphical user interface that depicts the graphic and an image of a remote vehicle that is following the ego vehicle. Other embodiments of this aspect include corresponding computer systems, apparatus, and computer programs recorded on one or more computer storage devices, each configured to perform the actions of the methods.

Implementations may include one or more of the following features. The method where the target vehicle is the ego vehicle. The target vehicle is the remote vehicle. The target vehicle is a simulated vehicle and the driving behavior is an idealization of a driver whose driving behavior satisfies a threshold for caution. The target vehicle is a historical vehicle whose driving behavior was recorded by a sensor set of the ego vehicle in a past. The electronic display includes a heads-up display unit. The electronic display is an element of an infotainment system. The graphic is displayed responsive to a determination that an ego driving behavior of the ego vehicle does not satisfy a threshold for safety. The graphic is displayed responsive to a determination that a following driving behavior of the remote vehicle does not satisfy a threshold for safety. The graphic includes a graphical representation of the ego vehicle. The graphic does not include a picture of ego vehicle as it appears in real-life. The graphic includes a picture of ego vehicle as it appears in real-life. The image includes a graphical representation of the remote vehicle. The image does not include a picture of remote vehicle as it appears in real-life. The image includes a picture of remote vehicle as it appears in real-life. Causing the electronic display to depict the graphic includes generating graphical data describing the graphical user interface including the graphic and the image and providing the graphical data to the electronic display to cause the electronic display to depict the graphical user interface including the graphic and the image. A time delay between recordation of the sensor data and depiction of the graphical user interface satisfies a threshold for latency. A time delay between recordation of the sensor data and depiction of the graphical user interface is substantially zero seconds. Implementations of the described techniques may include hardware, a method or process, or computer software on a computer-accessible medium.

One general aspect includes a non-transitory memory and a processor communicatively coupled to the non-transitory memory, where the non-transitory memory stores computer readable code that is operable, when executed by the processor, to cause the processor to execute steps including: generating a model of a driving behavior of a target vehicle based on sensor data describing the driving behavior and a roadway environment; determining a graphic of a phantom vehicle based on the model; and causing an electronic display of an ego vehicle to depict the graphic as an element of a graphical user interface that depicts the graphic and an image of a remote vehicle that is following the ego vehicle. Other embodiments of this aspect include corresponding computer systems, apparatus, and computer programs recorded on one or more computer storage devices, each configured to perform the actions of the methods.

One general aspect includes a computer program product including computer code stored on a non-transitory memory that is operable, when executed by the generating a model of a driving behavior of a target vehicle based on sensor data describing the driving behavior and a roadway environment; determining a graphic of a phantom vehicle based on the model, and causing an electronic display of an ego vehicle to depict the graphic as an element of a graphical user interface that depicts the graphic and an image of a remote vehicle that is following the ego vehicle. Other embodiments of this aspect include corresponding computer systems, apparatus, and computer programs recorded on one or more computer storage devices, each configured to perform the actions of the methods.

BRIEF DESCRIPTION OF THE DRAWINGS

The disclosure is illustrated by way of example, and not by way of limitation in the figures of the accompanying drawings in which like reference numerals are used to refer to similar elements.

DETAILED DESCRIPTION

Figure 1:
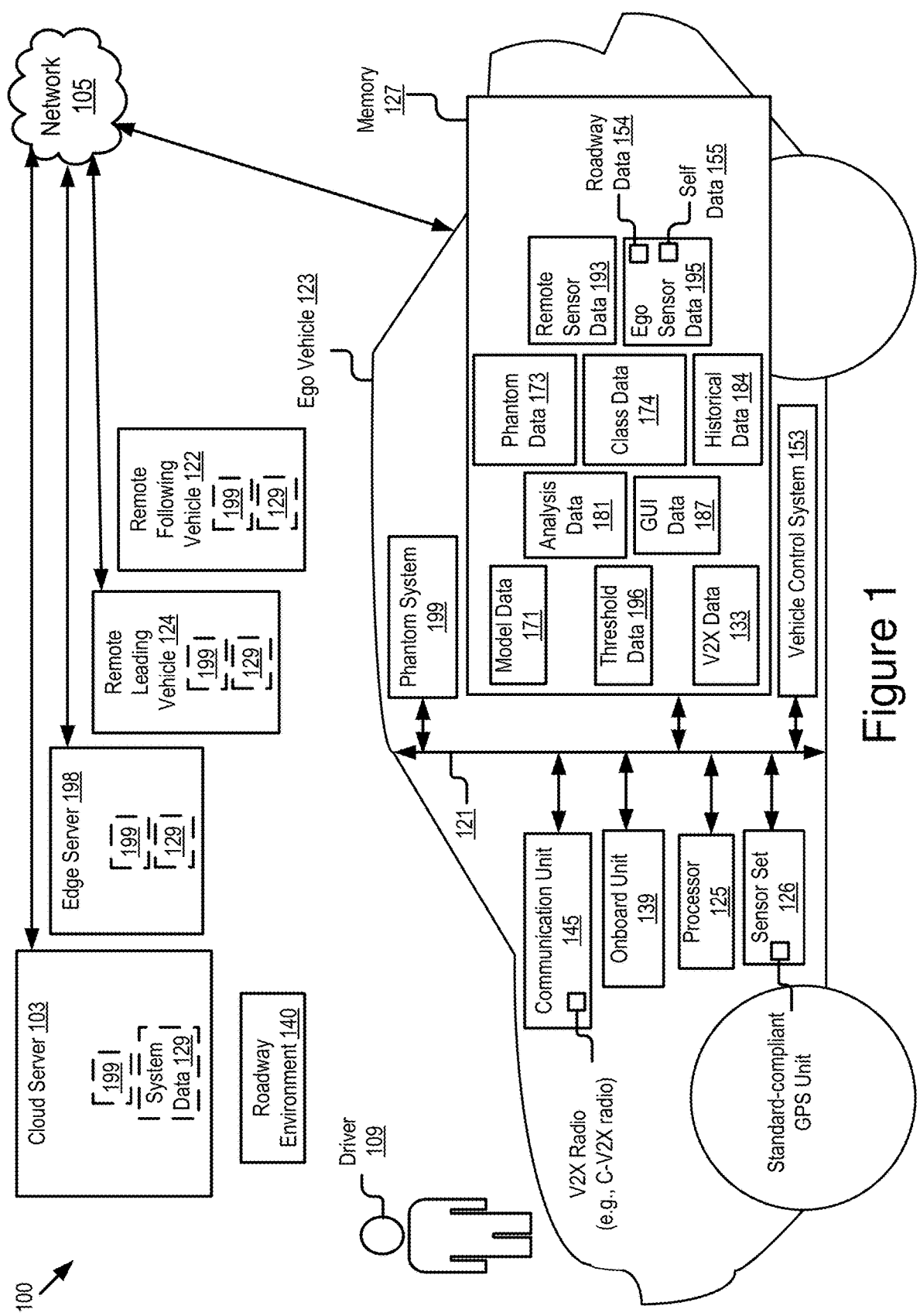
FIG. 1 is a block diagram illustrating an operating environment for a phantom system according to some embodiments.

Described herein are embodiments of a phantom system. The functionality of the phantom system is now introduced according to some embodiments.

Vehicles include onboard sensors that constantly record sensor data describing sensor measurements of the onboard sensors. These sensor measurements describe conditions inside the cabin of the vehicle as well as sensor measurements of the external environment of the vehicle. In some embodiments, the sensor data is time stamped so that individual sensor measurements recorded by the onboard sensors include a time stamp describing the time when the sensor measurement was recorded. Time data includes digital data that describes the time stamps for the sensor measurements that are described by the sensor data. Vehicles transmit V2X messages to one another.

In some embodiments, the phantom system is an ADAS system that assists a driver of a vehicle that includes the phantom system to do one or more of the following: monitor the driving of a vehicle that is following them; understand when the driver of the following vehicle is driving poorly; understand changes they can to their own driving so that they do not drive like the driver of the following vehicle; monitor their own driving after they make changes to confirm that they are driving better; and make changes to their own present driving pattern (e.g., speed, lane of travel, etc.) to avoid driving proximate to the following vehicle that was identified as driving poorly.

In some embodiments, the phantom system beneficially generates a graphic of a phantom vehicle. In some embodiments, the phantom system is an element of an ego vehicle. The phantom vehicle mimics the behavior of the ego vehicle. The ego vehicle is being operated in a safer manner (e.g., the driving behavior of the ego vehicle satisfies a threshold for safety). The phantom vehicle is depicted as a graphical element with a graphical user interface (GUI) that includes visual representations of other vehicles. The driver of the ego vehicle is presented with the GUI. The GUI gives the driver a visual cue that helps them be aware of the driving behavior of other vehicles on the roadway proximate to the ego vehicle. For example, if another vehicle is driving similar to the driving behavior of a distracted driver (e.g., the driving behavior of the other vehicle satisfies a threshold for distraction), then the GUI makes the driver of the ego vehicle aware of this circumstance. Other examples are possible.

For example, the other driver may be driving safely, timidly, or aggressively (e.g., the driving behavior of the ego vehicle satisfies a threshold for safety, timidity, or aggression, respectively), and the GUI makes the driver of the ego vehicle aware of this circumstances.

The phantom system is configured to display the GUI on an electronic display device. The electronic display device includes any electronic display device that is communicatively coupled to the phantom system and configured to receive GUI data from the phantom system, generate one or more GUIs based on the GUI data, and display the GUIs on the electronical display device.

Examples of an electronic display device include one or more of the following: a touch screen; an electronic display; a heads-up display; and any other electronic display device. In some embodiments, the electronic display device is embedded in a surface of the ego vehicle such as a rear-view mirror, a side mirror, a windshield, etc. GUI data includes digital data that is operable to cause the electronic display device to generate a GUI. In some embodiments, the phantom system generates the GUI data based on one or more of the following: the sensor data recorded by an onboard sensor set of the ego vehicle; sensor data recorded a sensor set of one or more remote vehicles; one or more properties of the electronic display device on which the GUI will be displayed (e.g., display size, pixel density of the electronic display device, refresh rate of the electronic display device, supported data protocols of the electronic display device, etc.).

Figure 2:
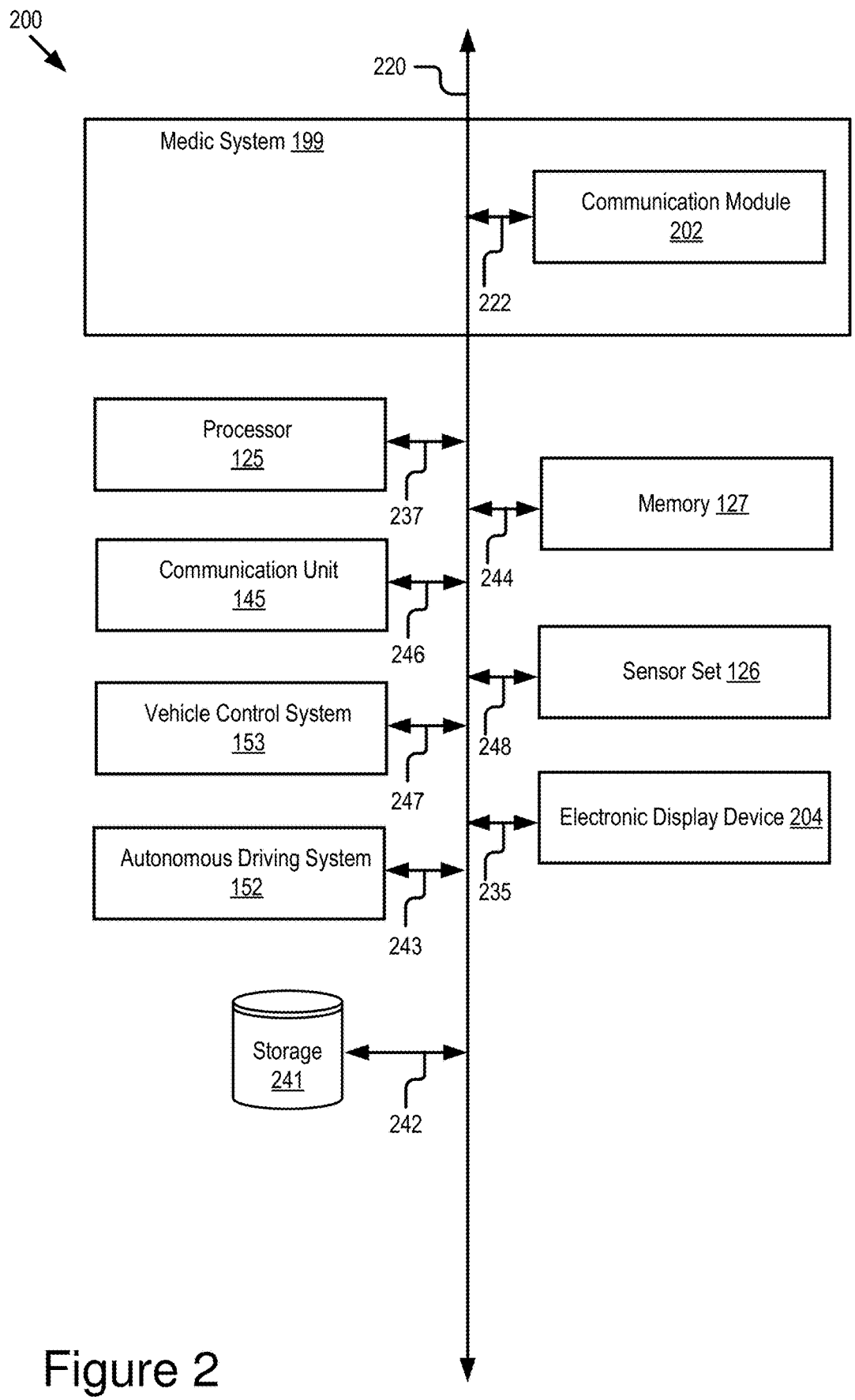
FIG. 2 is a block diagram illustrating an example computer system including a phantom system according to some embodiments.

An example of the electronic display device according to some embodiments includes the electronic display device 204 depicted in FIG. 2. An example of a GUI according to some embodiments includes the GUI 599 depicted in FIG. 5. An example of the GUI data according to some embodiments includes the GUI data 187 depicted in FIG. 1.

Accordingly, a phantom vehicle includes a graphical representation of a vehicle such as the ego vehicle or some other vehicle. The graphical representation can be included as a graphical element of a GUI.

In some embodiments, the phantom vehicle includes a mirrored image of the ego vehicle (or some other visual representation) that imitates the driving behavior of the ego vehicle as described by the sensor data stored in a non-transitory memory of the ego vehicle. In some embodiments, if the driver of the ego vehicle driver is driving safely (e.g., their driving behavior, as measured by the sensors of one or more of the ego vehicle and one or more remote vehicles, satisfies a threshold for safety), then the driver of the ego vehicle will feel comfortable when they see their phantom car following behind them as depicted in the GUI (see, e.g., the GUI 599 depicted in FIG. 5). In some embodiments, if the driver of the ego vehicle driver is not driving safely (e.g., their driving behavior, as measured by the sensors of one or more of the ego vehicle and one or more remote vehicles, does not satisfy a threshold for safety or satisfies some other threshold associated with bad driving), then the driver of the ego vehicle will realize how bad their driving is when they see their phantom car following behind them as depicted in the GUI (see, e.g., the GUI 599 depicted in FIG. 5).

Phantom data includes digital data that describes one or more of the following: the visual appearance of the phantom vehicle; and the behavior of the phantom vehicle. In some embodiments, the phantom vehicle is an element of the GUI data. An example of the phantom data according to some embodiments includes the phantom data 173 depicted in FIG. 1.

Figure 5:
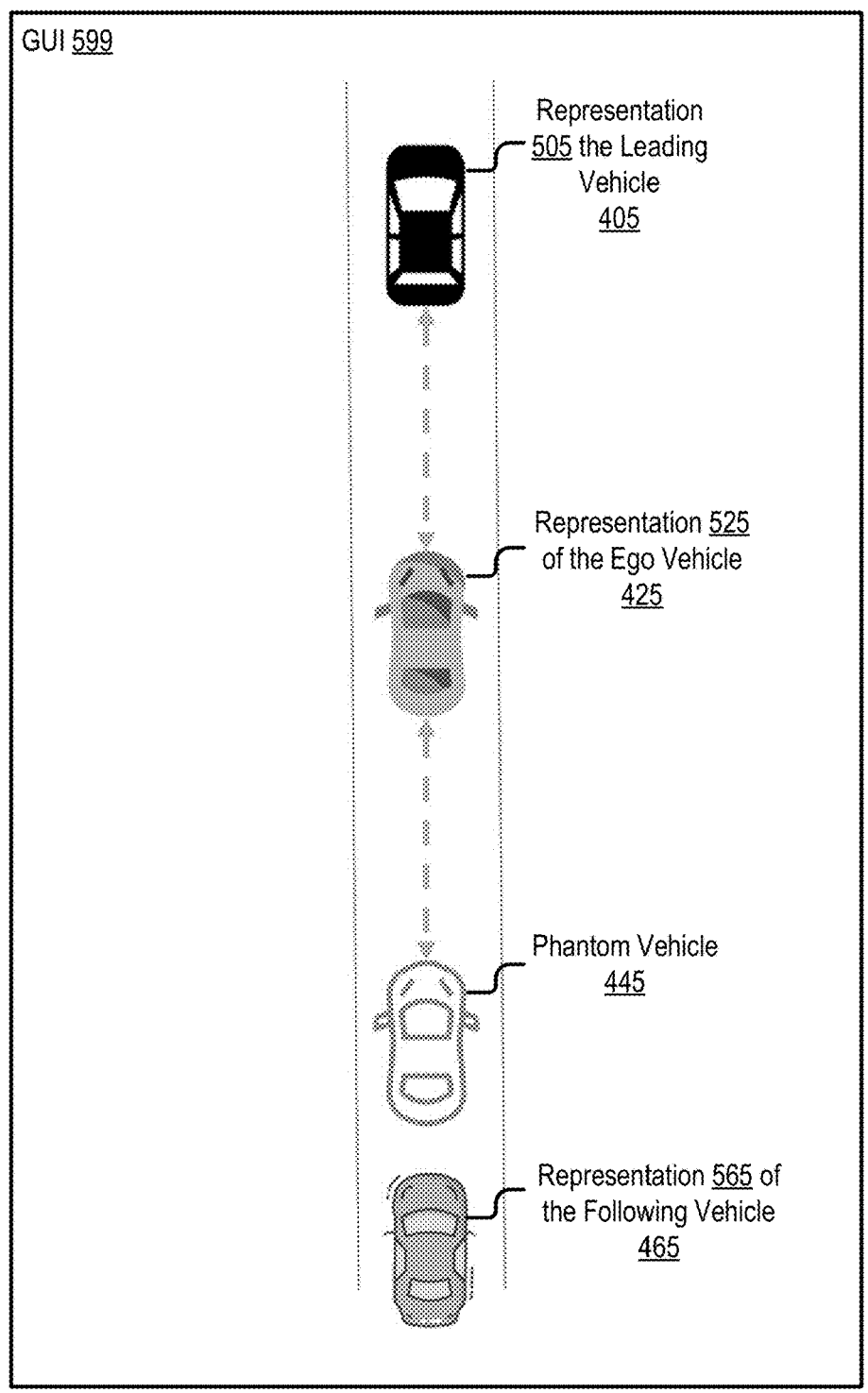
FIG. 5 is a block diagram illustrating an example of a graphical user interface according to some embodiments.

In some embodiments, if the driver of the ego vehicle driver is driving safely (e.g., their driving behavior, as measured by the sensors of one or more of the ego vehicle and one or more remote vehicles, satisfies a threshold for safety), then the driver of the ego vehicle will feel comfortable when they see their phantom car following behind them as depicted in the GUI (see, e.g., the GUI 599 depicted in FIG. 5). In some embodiments, if the driver of the ego vehicle driver is not driving safely (e.g., their driving behavior, as measured by the sensors of one or more of the ego vehicle and one or more remote vehicles, does not satisfy a threshold for safety or satisfies some other threshold associated with bad driving), then the driver of the ego vehicle will realize how bad their driving is when they see their phantom car following behind them as depicted in the GUI (see, e.g., the GUI 599 depicted in FIG. 5).

In some embodiments, the phantom vehicle includes a visual representation that imitates the driving behavior of a vehicle operated in a particular manner. For example, the phantom vehicle imitates the driving behavior of a vehicle that is operated by a driver from one or more of the following classification types: an aggressive driver; a distracted driver; a sleepy driver; a drunk driver; a timid driver; etc. Class data includes digital data that describes the driving behavior of a vehicle that is operated in accordance with one or more of these classification types. An example of the class data according to some embodiments includes the class data 174 depicted in FIG. 1.

In some embodiments, the phantom vehicle includes a visual representation that imitates a vehicle whose driving behavior was recorded by one or more sensors at an earlier time (i.e., a "historical vehicle"). For example, the sensors of one or more of the ego vehicle and one or more remote vehicles recorded the driving behavior of a historical vehicle at an earlier time and the visual representation of the phantom vehicle (or some other vehicle depicted in the GUI) is configured to behave like this phantom vehicle. Historical data includes digital data that describes the driving behavior of the historical vehicle. An example of the historical data according to some embodiments includes the historical data 184 depicted in FIG. 1.

In some embodiments, the GUI is configured so that the phantom vehicle is depicted along with a visual representation of the actual vehicle that is following the ego vehicle at the present time (e.g., the "following vehicle"). In some embodiments, the visual representation of the following vehicle includes one of the following: an image of the following vehicle that is captured by a camera included in the sensor set of the ego vehicle; a video of the following vehicle which is being recorded in real-time or near real-time (e.g., via a back-up camera of the ego vehicle or some other back-facing camera of the ego vehicle); and a graphical image that visually represents the following vehicle (e.g., a cartoon image of the following vehicle or some other image of the following vehicle that is not a real image but is visually similar to the following vehicle and mimics the driving behavior of the following vehicle).

In some embodiments, the visual representation of the following vehicle mimics the actual driving behavior of the following vehicle including one or more of the following: the following distance of the following vehicle relative to the ego vehicle; the driving speed of the following vehicle; the driving acceleration of the following vehicle; the placement of the following vehicle in the roadway relative to points of interest such as the lane lines diving the roadway and other objects in the roadway; one or more of the prior listed variables over time; any other visually observable variable describing the following vehicle. In this way, the GUI generated by the phantom system helps the driver of the ego vehicle quantify and understand the risk of the following vehicle to the ego vehicle and/or other vehicles on the roadway.

The sensor data includes digital data describing the sensor measurements recorded by the onboard sensors (e.g., the sensor set) of one or more vehicles. In some embodiments, instances of sensor data describe one or more sensor measurements, and the instances of sensor data are timestamped with time data to indicate the time when the one or more sensor measurements were recorded.

Ego sensor data includes digital data that describes the sensor measurements recorded by the sensor set of the ego vehicle. An example of the ego sensor data in some embodiments includes the ego sensor data 195 depicted in FIG. 1. In some embodiments, the sensor measurements described by the ego sensor data 195 are time stamped. Time data includes digital data that describes the time stamps for the sensor measurements described by the ego sensor data 195.

The ego sensor data includes two categories of sensor data: roadway data; and self data. These digital data types are now described.

Roadway data includes digital data that describes the sensor measurements recorded by the sensor set of an ego vehicle and describing the conditions external to the ego vehicle. For example, the roadway data describes the roadway environment that includes the ego vehicle. An example of the roadway data according to some embodiments includes the roadway data 154 depicted in FIG. 1.

Self data includes digital data that describes the sensor measurements recorded by the sensor set of the ego vehicle and describing the ego vehicle itself. For example, the self data describes information about the ego vehicle, or the operation of the ego vehicle, and not the roadway environment per se. An example of the self data according to some embodiments includes the self data 155 depicted in FIG. 1.

Remote vehicles also include sensor sets similar to those included in the ego vehicle. Remote sensor data includes digital data that describes the sensor measurements recorded by the sensor set of a remote vehicle. An example of the remote sensor data in some embodiments includes the remote sensor data 193 depicted in FIG. 1. In some embodiments, the sensor measurements described by the remote sensor data 193 are time stamped. Time data includes digital data that describes the time stamps for the sensor measurements described by the remote sensor data 193.

In some embodiments, the remote sensor data 193 is beneficial, for example, because it helps the phantom system have a better understanding of roadway environment of the ego vehicle (e.g., because the sensors of the remote vehicle are more accurate than those of the ego vehicle or have a different perspective relative to the sensors of the ego vehicle due to their different orientation or proximity relative to the sensors of the ego vehicle) or a better understanding about the ego vehicle itself, or the operation thereof. In some embodiments, the remote sensor data 193 is used by the phantom system 199 to enhance or confirm the accuracy of the ego sensor data.

In some embodiments, the remote sensor data 193 is transmitted to the ego vehicle via V2X messages. V2X messages include V2X data in their payload. The V2X data includes, among other things, the sensor data such as the remote sensor data 193 that vehicles record using their sensor sets. Vehicles that receive these V2X messages use this V2X data to improve their awareness of their environment. For vehicles that include Advanced Driver Assistance Systems (ADAS systems) or autonomous driving systems, the V2X data is inputted to these systems so that they can better understand their driving environment when providing their functionality.

An example of one specific type of sensor data includes GPS data. "GPS" refers to "geographic positioning system." The GPS data includes digital data that describes the geographic location of an object such as a vehicle or a smartphone.

An example of the V2X data according to some embodiments includes the V2X data 133 depicted in FIG. 1. For example, with reference to FIG. 1, the remote sensor data is received by the communication unit of the ego vehicle via a V2X transmission that includes V2X data including the remote sensor data as its payload; the phantom system of the ego vehicle then parses the remote sensor data from the V2X data and stores the V2X data and the remote sensor data in the memory 127 of the ego vehicle 123.

As used herein, the term "sensor data" refers to one or more of the ego sensor data, the remote sensor data, or a combination of the ego data and the remote sensor data.

The driver 109 is a human driver of the ego vehicle 123. In some embodiments, the driver 109 is the occupant of the ego vehicle 123 that is experiencing the medical condition.

Threshold data includes digital data that describes any threshold described herein. An example of the threshold data includes the threshold data 196 depicted in FIG. 1.

A vehicle control system is an onboard system of a vehicle that controls the operation of a functionality of the vehicle. ADAS systems and autonomous driving systems are examples of vehicle control systems. Examples of the vehicle control system according to some embodiments includes the vehicle control system 153 depicted in FIGS. 1 and 2 and the autonomous driving system 152 depicted in FIG. 2.

Example General Method

In some embodiments, the phantom system includes code and routines that are operable, when executed by a processor, to cause the processor to execute one or more steps of an example general method described herein. The phantom system may be an element of one or more of the following: an ego vehicle; a remote connected vehicle; a cloud server; and an edge server installed in a roadway device such as a roadside unit (RSU). As described, the phantom system is an element of the ego vehicle, but this description is not intended to be limiting.

In some embodiments, these steps are executed by a processor or onboard vehicle computer of an ego vehicle. The ego vehicle is a connected vehicle. A connected vehicle is a vehicle that includes a communication unit. An example of a communication unit includes the communication unit 145 depicted in FIG. 1. The remote connected vehicle is also a connected vehicle, and so, it includes a communication unit.

As used herein, the term "wireless message" refers to a V2X message transmitted by a communication unit of a connected vehicle such as a remote connected vehicle or the ego vehicle.

The example general method is now described. In some embodiments, one or more steps of the example general method are skipped or modified. The steps of the example general method may be executed in any order, and not necessarily the order presented.

In some embodiments, a plurality of vehicles on a roadway include instances of the phantom system and the phantom systems of these vehicles also execute some or all of the steps described below. For example, one or more of these steps are executed by the members of a vehicular micro cloud in some embodiments. In some embodiments, a server such as a cloud server or an edge server includes an instance of the phantom system, and one or more steps are executed by the phantom system of one or more of these entities.

The steps of the example general method are now described according to some embodiments.

Step 1: The phantom system causes the sensor set of the ego vehicle to record ego sensor data. The ego sensor data includes digital data that describes the sensor measurements of the sensors that are included in the sensor set of the ego vehicle. In some embodiments, the individual sensor measurements are time stamped so an instance of ego sensor data describes both a sensor measurement and when this measurement was recorded. In some embodiments, the ego sensor data includes time data that describes the timestamps for the sensor measurements.

In some embodiments, the sensor measurements described by the ego sensor data describe one or more of the following types of digital data: the ego vehicle over time including its location in a roadway environment over time; the location of the ego vehicle relative to other objects within the roadway environment over time; the driver's operation of the ego vehicle over time, the presence of other objects over time within the roadway environment that includes the ego vehicle; the location of these objects in the roadway over time relative to other objects (e.g., the location of these other objects relative to one another and relative to the ego vehicle); the behavior of these other objects over time; the geometry of the roadway over time; features in the roadway over time and changes in one or more of their position, velocity, and acceleration; kinematic information about the ego vehicle and/or any objects in the roadway environment; and any aspect of the roadway environment that is measurable by the sensors included in the sensor set of the ego vehicle.

The sensors included in the sensor set, and the type of measurements they can record, are described in more detail below.

Step 2: (Optional) A set of one or more remote vehicles in sensor range of the ego vehicle include their own instance of the phantom system. The phantom system of these remote vehicles causes the sensor sets of these remote vehicles to record sensor measurements of their roadway environment, including measurements of one or more of the following: the ego vehicle; the following vehicle traveling immediately in front of the ego vehicle in the same lane of travel and having the same heading as the ego vehicle; and the leading vehicle traveling immediately in front of the ego vehicle in the same lane of travel and having the same heading as the ego vehicle. These sensor measurements include sensor measurements similar to those described herein for the sensor data 195.

Figure 4:
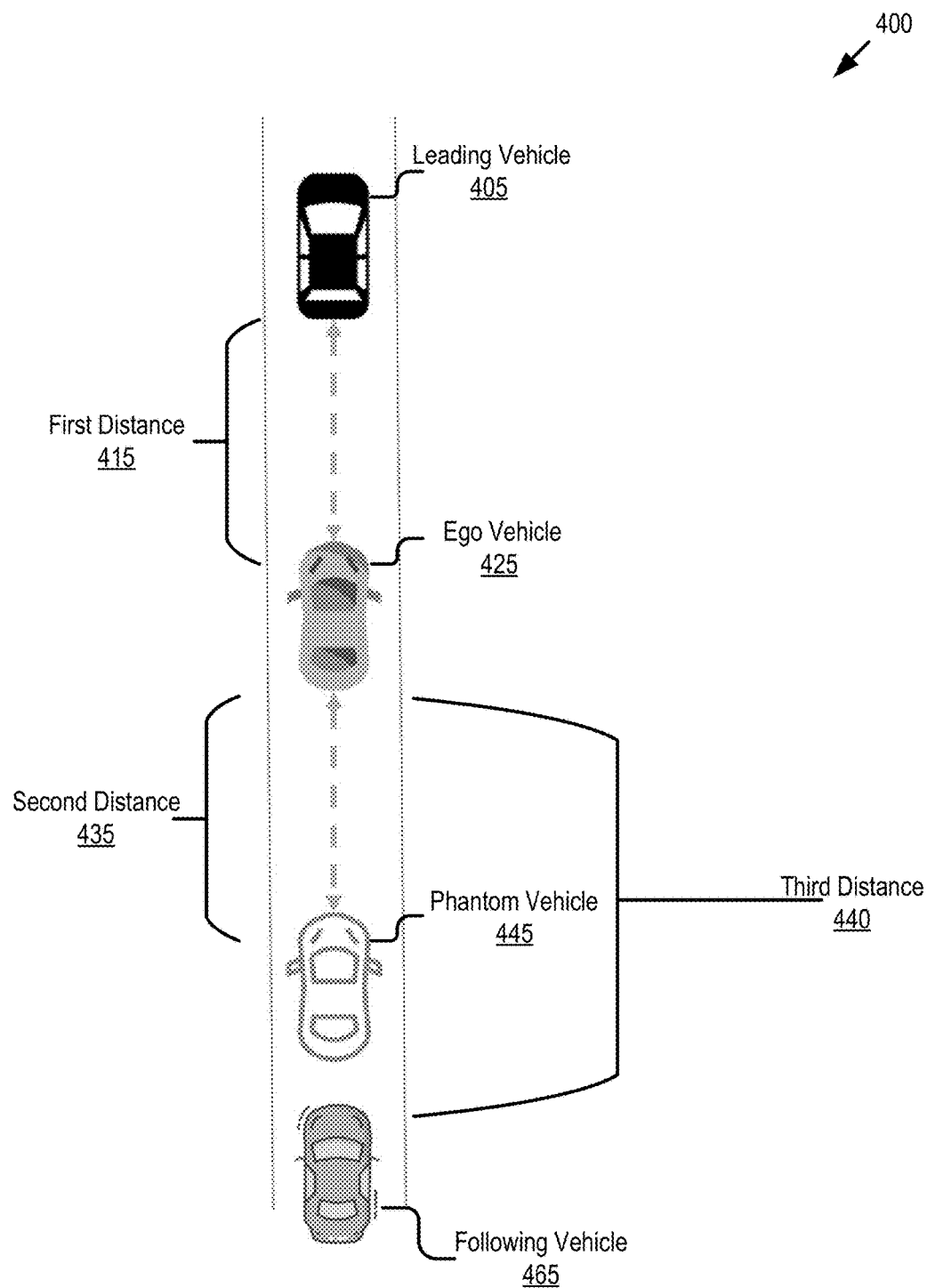
FIG. 4 is a block diagram illustrating an analysis for determining how to generate a graphical user interface according to some embodiments.

FIG. 4 depicts examples of the leading vehicle, ego vehicle, and the following vehicle according to some embodiments. For example, an example of the leading vehicle according to some embodiments includes the leading vehicle 405 depicted in FIG. 4. An example of the ego vehicle according to some embodiments includes the ego vehicle 425 depicted in FIG. 4. An example of the following vehicle according to some embodiments includes the following vehicle 465 depicted in FIG. 4. In some embodiments, the sensor measurements recorded by the sensor set(s) include distances between the vehicles 405, 425, 465. For example, the sensor sets of one or more remote vehicles (and/or the ego vehicle itself) measures one or more of the first distance 415 and the third distance 440. In some embodiments, the phantom system determines the second distance based on one or more of the first distance 415 and the third distance 440 (e.g., a distance to a point between the ego vehicle 425 and the following vehicle 465 that visually includes enough pixels to depict the phantom vehicle 445).

The sensor measurements recorded by an individual remote connected vehicle from a set of remote vehicles is described by remote sensor data. The remote sensor data includes digital data that describes the sensor measurements of the sensors that are included in the sensor set of the remote connected vehicle. In some embodiments, the individual sensor measurements are time stamped so an instance of remote sensor data describes both a sensor measurement and when this measurement was recorded. In some embodiments, the remote sensor data includes time data that describes the timestamps for the sensor measurements.

In some embodiments, the sensor measurements described by the remote sensor data describe one or more of the following: the remote connected vehicle over time including its location in a roadway environment over time; the location of the remote connected vehicle relative to other objects within the roadway environment over time; a driver's operation of the remote connected vehicle over time, the presence of other objects (including the presence of the ego vehicle) over time within the roadway environment that includes the remote connected vehicle; the location of these objects (including the location of the ego vehicle) in the roadway over time relative to other objects (e.g., the location of the ego vehicle relative to the remote connected vehicle as measured from the perspective of the remote connected vehicle); the behavior of these other objects (including the behavior of the ego vehicle) over time; the geometry of the roadway over time; features in the roadway over time and changes in one or more of their position, velocity, and acceleration; kinematic information about the remote vehicle and/or any objects in the roadway environment; and any aspect of the roadway environment that is measurable by the sensors included in the sensor set of the remote vehicle The sensors included in the sensor sets of the remote vehicles are similar to those included in the ego vehicle.

Step 3: The phantom system of the ego vehicle is executed by a processor of the ego vehicle. The phantom system, when executed by the processor, causes the processor to determine a model of the driving behavior of one or more of the following elements of the roadway environment: the ego vehicle; the leading vehicle; and the following vehicle. The model includes digital data that describes the dynamic behavior of the element it describes over a period of time. For example, the model of the ego vehicle describes the behavior of the ego vehicle over a period of time.

In some embodiments, the phantom system analyzes the sensor data to generate the model data. For example, the phantom system analyzes the sensor data to determine which measurements included in the sensor data describe which of the elements that are present in the roadway environment and then determine models for one or more of these elements based on the sensor data describing that element. In some embodiments, the analysis includes selecting which of the elements to include in the GUI generated by the phantom system so that the analysis includes determining which sensor measurements to ignore and which sensor measurements to consider. Analysis data includes digital data that describes the output and steps of this analysis. An example of the analysis data according to some embodiments includes the analysis data 181 depicted in FIG. 1.

Step 4: The phantom system of the ego vehicle is executed by a processor of the ego vehicle. The phantom system, when executed by the processor, causes the processor to generate the GUI data based at least in part on the model data and the roadway data. The roadway data is sued by the phantom system to generate the portions of the GUI that depict the roadway itself. The model data is used by the GUI to generate some or all of the dynamic elements of the roadway such as the vehicles as described herein.

Step 5: The phantom system of the ego vehicle is executed by a processor of the ego vehicle. The phantom system, when executed by the processor, causes the processor to provide the GUI data to an electronic display device of the ego vehicle.

Step 6: The phantom system of the ego vehicle is executed by a processor of the ego vehicle. The phantom system, when executed by the processor, causes the processor to display the GUI on the electronic display device based on the GUI data.

Vehicle Control System

The National Highway Traffic Safety Administration ("NHTSA") has defined different "levels" of autonomous vehicles, e.g., Level 0, Level 1, Level 2, Level 3, Level 4, and Level 5. If an autonomous vehicle has a higher-level number than another autonomous vehicle (e.g., Level 3 is a higher-level number than Levels 2 or 1), then the autonomous vehicle with a higher-level number offers a greater combination and quantity of autonomous features relative to the vehicle with the lower-level number. The different levels of autonomous vehicles are described briefly below.

Level 0: The vehicle control systems installed in a vehicle have no vehicle control. The vehicle control systems may issue warnings to the driver of the vehicle. A vehicle which is Level 0 is not an autonomous or semi-autonomous vehicle.

Level 1: The driver must be ready to take driving control of the autonomous vehicle at any time. The vehicle control systems installed in the autonomous vehicle may provide autonomous features such as one or more of the following: Adaptive Cruise Control (ACC); and Parking Assistance with automated steering and Lane Keeping Assistance (LKA) Type II, in any combination.

Level 2: The driver is obliged to detect objects and events in the roadway environment and respond if the vehicle control systems installed in the autonomous vehicle fail to respond properly (based on the driver's subjective judgement). The vehicle control systems installed in the autonomous vehicle executes accelerating, braking, and steering. The vehicle control systems installed in the autonomous vehicle can deactivate immediately upon takeover by the driver.

Level 3: Within known, limited environments (such as freeways), the driver can safely turn their attention away from driving tasks but must still be prepared to take control of the autonomous vehicle when needed.

Level 4: The vehicle control systems installed in the autonomous vehicle can control the autonomous vehicle in all but a few environments such as severe weather. The driver must enable the automated system (which is comprised of the vehicle control systems installed in the vehicle) only when it is safe to do so. When the automated system is enabled, driver attention is not required for the autonomous vehicle to operate safely and consistent with accepted norms.

Level 5: Other than setting the destination and starting the system, no human intervention is required. The automated system can drive to any location where it is legal to drive and make its own decision (which may vary based on the jurisdiction where the vehicle is located).

A highly autonomous vehicle (HAV) is an autonomous vehicle that is Level 3 or higher.

Accordingly, in some embodiments the ego vehicle 123 is one of the following: a Level 1 autonomous vehicle; a Level 2 autonomous vehicle; a Level 3 autonomous vehicle; a Level 4 autonomous vehicle; a Level 5 autonomous vehicle; and an HAV.

In some embodiments, the vehicle control systems includes one or more of the following ADAS systems: an ACC system; an adaptive high beam system; an adaptive light control system; an automatic parking system; an automotive night vision system; a blind spot monitor; a collision avoidance system; a crosswind stabilization system; a driver drowsiness detection system; a driver monitoring system; an emergency driver assistance system; a forward collision warning system; an intersection assistance system; an intelligent speed adaption system; a lane departure warning system (also referred to as a LKA system); a pedestrian protection system; a traffic sign recognition system; a turning assistant; a wrong-way driving warning system; autopilot; sign recognition; and sign assist. Each of these example ADAS systems provide their own features and functionality that may be referred to herein as an "ADAS feature" or an "ADAS functionality," respectively. The features and functionality provided by these example ADAS systems are also referred to herein as an "autonomous feature" or an "autonomous functionality," respectively.

In some embodiments, reducing an autonomy level of the ego vehicle includes reducing a functionality or degree of driver assistance provided by one or more of the ADAS systems of the ego vehicle. In some embodiments, increasing an autonomy level of the ego vehicle includes increasing a functionality or degree of driver assistance provided by one or more of the ADAS systems of the ego vehicle. In some embodiments, the ego vehicle is sold with only a portion of the ADAS software and/or ADAS hardware enabled. This ADAS software and/or ADAS hardware can be enabled at a later date, for example, in exchange for a fee. In some embodiments, the phantom system enables ADAS software and/or ADAS hardware responsive to detecting a medical condition in order to provide increased driving assistance to the driver of the ego vehicle while they are experiencing the medical condition. If all of the installed ADAS software and/or ADAS hardware is enabled, then this is referred to as "maximizing" the available autonomy level of the ego vehicle.

In some embodiments, system data includes some or all of the digital data described herein. In some embodiments, the communication unit of an ego vehicle includes a V2X radio. The V2X radio operates in compliance with a V2X protocol. In some embodiments, the V2X radio is a cellular-V2X radio ("C-V2X radio"). In some embodiments, the V2X radio broadcasts Basic Safety Messages ("BSM" or "safety message" if singular, "BSMs" or "safety messages" if plural). In some embodiments, the safety messages broadcast by the communication unit include some or all of the system data as its payload. In some embodiments, the system data is included in part 2 of the safety message as specified by the Dedicated Short-Range Communication (DSRC) protocol. In some embodiments, the payload includes digital data that describes, among other things, sensor data that describes a roadway environment that includes the members of the vehicular micro cloud.

As used herein, the term "vehicle" refers to a connected vehicle. For example, one or more of the ego vehicle, the remote following vehicle, and the remote leading vehicle depicted in FIG. 1 are connected vehicles.

A connected vehicle is a conveyance, such as an automobile, which includes a communication unit that enables the conveyance to send and receive wireless messages via one or more vehicular networks. The embodiments described herein are beneficial for both drivers of human-driven vehicles as well as the autonomous driving systems of autonomous vehicles. For example, the phantom system improves the performance of a vehicle control system, which benefits the performance of the vehicle itself by enabling it to operate more safety or in a manner that is more satisfactory to a human driver of the ego vehicle.

In some embodiments, the phantom system is software installed in an onboard unit (e.g., an electronic control unit (ECU)) of a vehicle having V2X communication capability. The vehicle is a connected vehicle and operates in a roadway environment with N number of remote vehicles that are also connected vehicles, where N is any positive whole number that is sufficient to satisfy a threshold for forming a vehicular micro cloud. The roadway environment may include one or more of the following example elements: an ego vehicle; N remote vehicles; a cloud server; and an edge server. The edge server may be an element of a roadside unit. For the purpose of clarity, the N remote vehicles may be referred to herein as the "remote connected vehicle" or the "remote vehicles" and this will be understood to describe N remote vehicles.

In some embodiments, the phantom system includes code and routines stored on and executed by a cloud server or an edge server.

The ego vehicle and the remote vehicles may be human-driven vehicles, autonomous vehicles, or a combination of human-driven vehicles and autonomous vehicles. In some embodiments, the ego vehicle and the remote vehicles may be equipped with DSRC equipment such as a GPS unit that has lane-level accuracy and a DSRC radio that is capable of transmitting DSRC messages.

Modern vehicles include one or more ADAS systems or automated driving systems. These systems are referred to herein collectively or individually as "vehicle control systems." An automated driving system includes a sufficient number of ADAS systems so that the vehicle which includes these ADAS systems is rendered autonomous by the benefit of the functionality received by the operation of the ADAS systems by a processor of the vehicle. An example of a vehicle control system according to some embodiments includes the vehicle control system 153 depicted in FIGS. 1 and 2.

A particular vehicle that includes these vehicle control systems is referred to herein as an "ego vehicle" and other vehicles in the vicinity of the ego vehicle as "remote vehicles." As used herein, the term "vehicle" includes a connected vehicle that includes a communication unit and is operable to send and receive V2X communications via a wireless network (e.g., the network 105 depicted in FIG. 1).

Modern vehicles collect a lot of data describing their environment, in particular image data. An ego vehicle uses this image data to understand their environment and operate their vehicle control systems (e.g., ADAS systems or automated driving systems).

As automated vehicles and ADAS systems become increasingly popular, it is important that vehicles have access to the best possible digital data that describes their surrounding environment. In other words, it is important for modern vehicles to have the best possible environmental perception abilities.

Vehicles perceive their surrounding environment by having their onboard sensors record sensor measurements and then analyzing the sensor data to identify one or more of the following: which objects are in their environment; where these objects are located in their environment; and various measurements about these objects (e.g., speed, heading, path history, etc.). This invention is about helping vehicles to have the best possible environmental perception abilities.

Vehicles use their onboard sensors and computing resources to execute perception algorithms that inform them about the objects that are in their environment, where these objects are located in their environment, and various measurements about these objects (e.g., speed, heading, path history, etc.).

Cellular Vehicle to Everything (C-V2X)

C-V2X is an optional feature of the embodiments described herein. Some of the embodiments described herein utilize C-V2X communications. Some of the embodiments described herein do not utilize C-V2X communications. For example, the embodiments described herein utilize V2X communications other than C-V2X communications. C-V2X is defined as 3GPP direct communication (PC5) technologies that include LTE-V2X, 5G NR-V2X, and future 3GPP direct communication technologies.

Dedicated Short-Range Communication (DSRC) is now introduced. A DSRC-equipped device is any processor-based computing device that includes a DSRC transmitter and a DSRC receiver. For example, if a vehicle includes a DSRC transmitter and a DSRC receiver, then the vehicle may be described as "DSRC-enabled" or "DSRC-equipped." Other types of devices may be DSRC-enabled. For example, one or more of the following devices may be DSRC-equipped: an edge server; a cloud server; a roadside unit ("RSU"); a traffic signal; a traffic light; a vehicle; a smartphone; a smartwatch; a laptop; a tablet computer; a personal computer; and a wearable device.

In some embodiments, instances of the term "DSRC" as used herein may be replaced by the term "C-V2X." For example, the term "DSRC radio" is replaced by the term "C-V2X radio," the term "DSRC message" is replaced by the term "C-V2X message," and so on.

In some embodiments, instances of the term "V2X" as used herein may be replaced by the term "C-V2X."

In some embodiments, one or more of the connected vehicles described above are DSRC-equipped vehicles. A DSRC-equipped vehicle is a vehicle that includes a standard-compliant GPS unit and a DSRC radio which is operable to lawfully send and receive DSRC messages in a jurisdiction where the DSRC-equipped vehicle is located. A DSRC radio is hardware that includes a DSRC receiver and a DSRC transmitter. The DSRC radio is operable to wirelessly send and receive DSRC messages on a band that is reserved for DSRC messages.

A DSRC message is a wireless message that is specially configured to be sent and received by highly mobile devices such as vehicles, and is compliant with one or more of the following DSRC standards, including any derivative or fork thereof: EN 12253:2004 Dedicated Short-Range Communication—Physical layer using microwave at 5.8 GHz (review); EN 12795:2002 Dedicated Short-Range Communication (DSRC)— DSRC Data link layer: Medium Access and Logical Link Control (review); EN 12834:2002 Dedicated Short-Range Communication—Application layer (review); and EN 13372:2004 Dedicated Short-Range Communication (DSRC)— DSRC profiles for RTTT applications (review); EN ISO 14906:2004 Electronic Fee Collection—Application interface.

A DSRC message is not any of the following: a WiFi message; a 3G message; a 4G message; an LTE message; a millimeter wave communication message; a Bluetooth message; a satellite communication; and a short-range radio message transmitted or broadcast by a key fob at 315 MHz or 433.92 MHz. For example, in the United States, key fobs for remote keyless systems include a short-range radio transmitter which operates at 315 MHz, and transmissions or broadcasts from this short-range radio transmitter are not DSRC messages since, for example, such transmissions or broadcasts do not comply with any DSRC standard, are not transmitted by a DSRC transmitter of a DSRC radio and are not transmitted at 5.9 GHz. In another example, in Europe and Asia, key fobs for remote keyless systems include a short-range radio transmitter which operates at 433.92 MHz, and transmissions or broadcasts from this short-range radio transmitter are not DSRC messages for similar reasons as those described above for remote keyless systems in the United States.

In some embodiments, a DSRC-equipped device (e.g., a DSRC-equipped vehicle) does not include a conventional global positioning system unit ("GPS unit"), and instead includes a standard-compliant GPS unit. A conventional GPS unit provides positional information that describes a position of the conventional GPS unit with an accuracy of plus or minus 10 meters of the actual position of the conventional GPS unit. By comparison, a standard-compliant GPS unit provides GPS data that describes a position of the standard-compliant GPS unit with an accuracy of plus or minus 1.5 meters of the actual position of the standard-compliant GPS unit. This degree of accuracy is referred to as "lane-level accuracy" since, for example, a lane of a roadway is generally about 3 meters wide, and an accuracy of plus or minus 1.5 meters is sufficient to identify which lane a vehicle is traveling in even when the roadway has more than one lanes of travel each heading in a same direction.

In some embodiments, a standard-compliant GPS unit is operable to identify, monitor and track its two-dimensional position within 1.5 meters, in all directions, of its actual position 68% of the time under an open sky.

GPS data includes digital data describing the location information outputted by the GPS unit.

In some embodiments, the connected vehicle described herein, and depicted in FIG. 1, includes a V2X radio instead of a DSRC radio. In these embodiments, all instances of the term DSRC" as used in this description may be replaced by the term "V2X." For example, the term "DSRC radio" is replaced by the term "V2X radio," the term "DSRC message" is replaced by the term "V2X message," and so on.

75 MHz of the 5.9 GHz band may be designated for DSRC. However, in some embodiments, the lower 45 MHz of the 5.9 GHz band (specifically, 5.85-5.895 GHz) is reserved by a jurisdiction (e.g., the United States) for unlicensed use (i.e., non-DSRC and non-vehicular related use) whereas the upper 30 MHz of the 5.9 GHz band (specifically, 5.895-5.925 GHz) is reserved by the jurisdiction for Cellular Vehicle to Everything (C-V2X) use. In these embodiments, the V2X radio depicted in FIG. 1 is a C-V2X radio which is operable to send and receive C-V2X wireless messages on the upper 30 MHz of the 5.9 GHz band (i.e., 5.895-5.925 GHz). In these embodiments, the phantom system 199 is operable to cooperate with the C-V2X radio and provide its functionality using the content of the C-V2X wireless messages.

In some of these embodiments, some or all of the digital data depicted in FIG. 1 is the payload for one or more C-V2X messages. In some embodiments, the C-V2X message is a BSM.

Vehicular Network

In some embodiments, the phantom system utilizes a vehicular network. A vehicular network includes, for example, one or more of the following: V2V; V2X; vehicle-to-network-to-vehicle (V2N2V); vehicle-to-infrastructure (V2I); C-V2X; any derivative or combination of the networks listed herein; and etc.

In some embodiments, the phantom system includes software installed in an onboard unit of a connected vehicle. This software is the "phantom system" described herein.

An example operating environment for the embodiments described herein includes an ego vehicle, one or more remote vehicles, and a recipient vehicle. The ego vehicle the remote connected vehicle are connected vehicles having communication units that enable them to send and receive wireless messages via one or more vehicular networks. In some embodiments, the recipient vehicle is a connected vehicle. In some embodiments, the ego vehicle and the remote connected vehicle include an onboard unit having a phantom system stored therein.

Some of the embodiments described herein include a server. However, some of the embodiments described herein do not include a server. A serverless operating environment is an operating environment which includes at least one phantom system and does not include a server.

Figure 3:
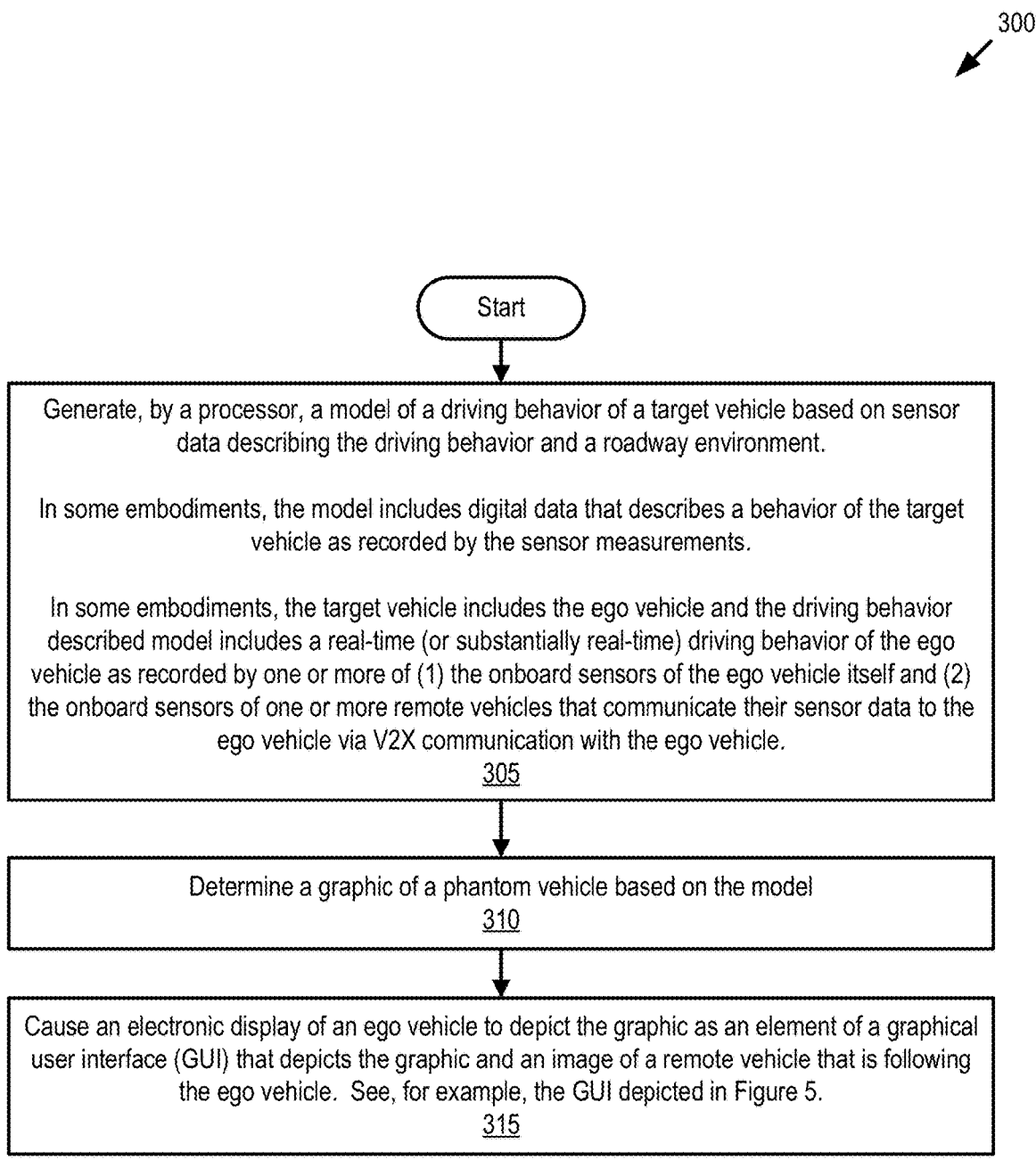
FIG. 3 is a flowchart of an example method for providing a medic service according to some embodiments.

In some embodiments, the phantom system includes code and routines that are operable, when executed by a processor of the onboard unit, to cause the processor to execute one or more of the steps of the method 300 depicted in FIG. 3 or any other method described herein (e.g., the example general method).

This patent application is related to U.S. patent application Ser. No. 15/644,197 filed on Jul. 7, 2017 and entitled "Computation Service for Mobile Nodes in a Roadway Environment," the entirety of which is hereby incorporated by reference. This patent application is also related to U.S. patent application Ser. No. 16/457,612 filed on Jun. 28, 2019 and entitled "Context System for Providing Cyber Security for Connected Vehicles," the entirety of which is hereby incorporated by reference.

Example Overview

In some embodiments, the phantom system is software that is operable, when executed by a processor, to cause the processor to execute one or more of the methods described herein. An example operating environment 100 for the phantom system is depicted in FIG. 1.

In some embodiments, the phantom system 199 is software installed in an onboard unit (e.g., an electronic control unit (ECU)) of a particular make of vehicle having V2X communication capability. For example, the ego vehicle 123 includes a communication unit 145. The communication unit 145 includes a V2X radio. For example, the communication unit 145 includes a C-V2X radio. FIG. 1 depicts an example operating environment 100 for the phantom system 199 according to some embodiments.

In some embodiments, the remote leading vehicle 124 is a connected vehicle, which is a vehicle such as the ego vehicle 123 having V2X communication capability. The remote following vehicle 122 is also a connected vehicle. In some embodiments, one or more of the remote leading vehicle 124 and the remote following vehicle 122 is not a connected vehicle. The ego vehicle 123 is a connected vehicle.

Example Operative Environment

Embodiments of the phantom system are now described. Referring now to FIG. 1, depicted is a block diagram illustrating an operating environment 100 for a phantom system 199 according to some embodiments. The operating environment 100 is present in a roadway environment 140. In some embodiments, each of the elements of the operating environment 100 is present in the same roadway environment 140 at the same time. In some embodiments, some of the elements of the operating environment 100 are not present in the same roadway environment 140 at the same time.

The roadway environment 140 includes objects. Examples of objects include one or of the following: other automobiles, road surfaces; signs, traffic signals, roadway paint, medians, turns, intersections, animals, pedestrians, debris, potholes, accumulated water, accumulated mud, gravel, roadway construction, cones, bus stops, poles, entrance ramps, exit ramps, breakdown lanes, merging lanes, other lanes, railroad tracks, railroad crossings, and any other tangible object that is present in a roadway environment 140 or otherwise observable or measurable by a camera or some other sensor included in the sensor set.

The operating environment 100 may include one or more of the following elements: an ego vehicle 123 (referred to herein as a "vehicle 123" or an "ego vehicle 123") (which has a driver 109 in embodiments where the ego vehicle 123 is not at least a Level 3 autonomous vehicle); a remote leading vehicle 124 (which has a driver similar to the driver 109 in embodiments where the remote leading vehicle 124 is not at least a Level 3 autonomous vehicle); a remote following vehicle 122 (which has a driver similar to the driver 109 in embodiments where the remote following vehicle 122 is not at least a Level 3 autonomous vehicle); a cloud server 103; and an edge server 198. These elements are communicatively coupled to one another via a network 105. These elements of the operating environment 100 are depicted by way of illustration. In practice, the operating environment 100 may include one or more of the elements depicted in FIG. 1. For example, although only two remote vehicles 122, 124 are depicted in FIG. 1, in practice the operating environment 100 can include a plurality of remote vehicles.

In some embodiments, the ego vehicle 123, the remote leading vehicle 124, and the remote following vehicle 122 include similar elements. For example, each of these elements of the operating environment 100 include their own processor 125, bus 121, memory 127, communication unit 145, processor 125, sensor set 126, onboard unit 139, and the phantom system 199 (optional). These elements of the ego vehicle 123, the remote leading vehicle 124, and the remote following vehicle 122 provide the same or similar functionality regardless of whether they are included in the ego vehicle 123, the remote leading vehicle 124, and the remote following vehicle 122. Accordingly, the descriptions of these elements will not be repeated in this description for each of the ego vehicle 123 and the remote leading vehicle 124. The phantom system 199 is an optional element of the remote leading vehicle 124 and the remote following vehicle 122; the presence of the phantom system 199 on these elements is not necessary for the phantom system 199 of the ego vehicle 123 to provide its functionality.

In the depicted embodiment, one or more of the ego vehicle 123, the remote leading vehicle 124, and the remote following vehicle 122 store similar digital data. The system data 129 includes digital data that describes some or all of the digital data stored in the memory 127 or otherwise described herein. The system data 129 is depicted in FIG. 1 as being an element of the cloud server 103, but in practice the system data 129 is stored on one or more of the cloud server 103, the edge server 198, the ego vehicle 123, one or more of the remote leading vehicles 124, and one or more following vehicles 122.

The network 105 is a conventional type, wired or wireless, and may have numerous different configurations including a star configuration, token ring configuration, or other configurations. Furthermore, the network 105 may include a local area network (LAN), a wide area network (WAN) (e.g., the Internet), or other interconnected data paths across which multiple devices and/or entities may communicate. In some embodiments, the network 105 may include a peer-to-peer network. The network 105 may also be coupled to or may include portions of a telecommunications network for sending data in a variety of different communication protocols. In some embodiments, the network 105 includes Bluetooth® communication networks or a cellular communications network for sending and receiving data including via short messaging service (SMS), multimedia messaging service (MMS), hypertext transfer protocol (HTTP), direct data connection, wireless application protocol (WAP), e-mail, DSRC, full-duplex wireless communication, mmWave, WiFi (infrastructure mode), WiFi (ad-hoc mode), visible light communication, TV white space communication and satellite communication. The network 105 may also include a mobile data network that may include 3G, 4G, 5G, millimeter wave (mmWave), LTE, LTE-V2X, LTE-D2D, VoLTE or any other mobile data network or combination of mobile data networks. Further, the network 105 may include one or more IEEE 802.11 wireless networks.

In some embodiments, the network 105 is a V2X network. For example, the network 105 must include a vehicle, such as the ego vehicle 123, as an originating endpoint for each wireless communication transmitted by the network 105. An originating endpoint is the endpoint that initiated a wireless communication using the network 105. In some embodiments, the network 105 is a vehicular network. In some embodiments, the network 105 is a C-V2X network.

In some embodiments, one or more of the ego vehicle 123, the remote leading vehicle 124, and the remote following vehicle 122 are C-V2X equipped vehicles. For example, the ego vehicle 123 includes a standard-compliant GPS unit that is an element of the sensor set 126 and a C-V2X radio that is an element of the communication unit 145. The network 105 may include a C-V2X communication channel shared among the ego vehicle 123 and a second vehicle such as the remote leading vehicle 124.

A C-V2X radio is hardware radio that includes a C-V2X receiver and a C-V2X transmitter. The C-V2X radio is operable to wirelessly send and receive C-V2X messages on a band that is reserved for C-V2X messages.

The ego vehicle 123 includes a car, a truck, a sports utility vehicle, a bus, a semi-truck, a drone, or any other roadway-based conveyance. In some embodiments, the ego vehicle 123 includes an autonomous vehicle or a semi-autonomous vehicle. Although not depicted in FIG. 1, in some embodiments, the ego vehicle 123 includes an autonomous driving system. The autonomous driving system includes code and routines that provides sufficient autonomous driving features to the ego vehicle 123 to render the ego vehicle 123 an autonomous vehicle or a highly autonomous vehicle. In some embodiments, the ego vehicle 123 is a Level III autonomous vehicle or higher as defined by the National Highway Traffic Safety Administration and the Society of Automotive Engineers. In some embodiments, the vehicle control system 153 is an autonomous driving system.

The ego vehicle 123 is a connected vehicle. For example, the ego vehicle 123 is communicatively coupled to the network 105 and operable to send and receive messages via the network 105. For example, the ego vehicle 123 transmits and receives V2X messages via the network 105.

The ego vehicle 123 includes one or more of the following elements: a processor 125; a sensor set 126; a vehicle control system 153; a communication unit 145; an onboard unit 139; a memory 127; and a phantom system 199. These elements may be communicatively coupled to one another via a bus 121. In some embodiments, the communication unit 145 includes a V2X radio.

The processor 125 includes an arithmetic logic unit, a microprocessor, a general-purpose controller, or some other processor array to perform computations and provide electronic display signals to a display device. The processor 125 processes data signals and may include various computing architectures including a complex instruction set computer (CISC) architecture, a reduced instruction set computer (RISC) architecture, or an architecture implementing a combination of instruction sets. Although FIG. 1 depicts a single processor 125 present in the ego vehicle 123, multiple processors may be included in the ego vehicle 123. The processor 125 may include a graphical processing unit. Other processors, operating systems, sensors, displays, and physical configurations may be possible.

In some embodiments, the processor 125 is an element of a processor-based computing device of the ego vehicle 123. For example, the ego vehicle 123 may include one or more of the following processor-based computing devices and the processor 125 may be an element of one of these devices: an onboard vehicle computer; an electronic control unit; a navigation system; a vehicle control system (e.g., an ADAS system or autonomous driving system); and a head unit. In some embodiments, the processor 125 is an element of the onboard unit 139.

The onboard unit 139 is a special purpose processor-based computing device. In some embodiments, the onboard unit 139 is a communication device that includes one or more of the following elements: the communication unit 145; the processor 125; the memory 127; and the phantom system 199. In some embodiments, the onboard unit 139 is the computer system 200 depicted in FIG. 2. In some embodiments, the onboard unit 139 is an electronic control unit (ECU).

The sensor set 126 includes one or more onboard sensors. The sensor set 126 records sensor measurements that describe the ego vehicle 123 and/or the physical environment (e.g., the roadway environment 140) that includes the ego vehicle 123. The ego sensor data 195 includes digital data that describes the sensor measurements.

In some embodiments, the sensor set 126 may include one or more sensors that are operable to measure the physical environment outside of the ego vehicle 123. For example, the sensor set 126 may include cameras, lidar, radar, sonar and other sensors that record one or more physical characteristics of the physical environment that is proximate to the ego vehicle 123.

In some embodiments, the sensor set 126 may include one or more sensors that are operable to measure the physical environment inside a cabin of the ego vehicle 123. For example, the sensor set 126 may record an eye gaze of the driver (e.g., using an internal camera), where the driver's hands are located (e.g., using an internal camera) and whether the driver is touching a head unit or infotainment system with their hands (e.g., using a feedback loop from the head unit or infotainment system that indicates whether the buttons, knobs or screen of these devices is being engaged by the driver).

In some embodiments, the sensor set 126 may include one or more of the following sensors: an altimeter; a gyroscope; a proximity sensor; a microphone; a microphone array; an accelerometer; a camera (internal or external); a LIDAR sensor; a laser altimeter; a navigation sensor (e.g., a global positioning system sensor of the standard-compliant GPS unit); an infrared detector; a motion detector; a thermostat; a sound detector, a carbon monoxide sensor; a carbon dioxide sensor; an oxygen sensor; a mass air flow sensor; an engine coolant temperature sensor; a throttle position sensor; a crank shaft position sensor; an automobile engine sensor; a valve timer; an air-fuel ratio meter; a blind spot meter; a curb feeler; a defect detector; a Hall effect sensor, a manifold absolute pressure sensor; a parking sensor; a radar gun; a speedometer; a speed sensor; a tire-pressure monitoring sensor; a torque sensor; a transmission fluid temperature sensor; a turbine speed sensor (TSS); a variable reluctance sensor; a vehicle speed sensor (VSS); a water sensor; a wheel speed sensor; and any other type of automotive sensor.

The sensor set 126 is operable to record ego sensor data 195. The ego sensor data 195 includes digital data that describes images or other measurements of the physical environment such as the conditions, objects, and other vehicles present in the roadway environment. Examples of objects include pedestrians, animals, traffic signs, traffic lights, potholes, etc. Examples of conditions include weather conditions, road surface conditions, shadows, leaf cover on the road surface, any other condition that is measurable by a sensor included in the sensor set 126.

The physical environment may include a roadway region, parking lot, or parking garage that is proximate to the ego vehicle 123. In some embodiments, the roadway environment 140 includes a roadway that includes a roadway region. The ego sensor data 195 may describe measurable aspects of the physical environment. In some embodiments, the physical environment is the roadway environment 140. As such, in some embodiments, the roadway environment 140 includes one or more of the following: a roadway region that is proximate to the ego vehicle 123; a parking lot that is proximate to the ego vehicle 123; a parking garage that is proximate to the ego vehicle 123; the conditions present in the physical environment proximate to the ego vehicle 123; the objects present in the physical environment proximate to the ego vehicle 123; and other vehicles present in the physical environment proximate to the ego vehicle 123; any other tangible object that is present in the real-world and proximate to the ego vehicle 123 or otherwise measurable by the sensors of the sensor set 126 or whose presence is determinable from the digital data stored on the memory 127. An item is "proximate to the ego vehicle 123" if it is directly measurable by a sensor of the ego vehicle 123 or its presence is inferable and/or determinable by the phantom system 199 based on analysis of the ego sensor data 195 which is recorded by the ego vehicle 123 and/or one or more members of the vehicular micro cloud 194.

In some embodiments, the ego sensor data 195 includes digital data that describes all of the sensor measurements recorded by the sensor set 126 of the ego vehicle.

For example, the ego sensor data 195 includes, among other things, one or more of the following: lidar data (i.e., depth information) recorded by an ego vehicle; or camera data (i.e., image information) recorded by the ego vehicle. The lidar data includes digital data that describes depth information about a roadway environment 140 recorded by a lidar sensor of a sensor set 126 included in the ego vehicle 123. The camera data includes digital data that describes the images recorded by a camera of the sensor set 126 included in the ego vehicle 123. The depth information and the images describe the roadway environment 140, including tangible objects in the roadway environment 140 and any other physical aspects of the roadway environment 140 that are measurable using a depth sensor and/or a camera.

In some embodiments, the sensors of the sensor set 126 are operable to collect ego sensor data 195. The sensors of the sensor set 126 include any sensors that are necessary to measure and record the measurements described by the ego sensor data 195. In some embodiments, the ego sensor data 195 includes any sensor measurements that are necessary to generate the other digital data stored by the memory 127. In some embodiments, the ego sensor data 195 includes digital data that describes any sensor measurements that are necessary for the phantom system 199 provides its functionality as described herein with reference to the method 300 depicted in FIG. 3 and/or the example general method described herein.

The ego sensor data 195 includes digital data that describes any measurement that is taken by one or more of the sensors of the sensor set 126.

The standard-compliant GPS unit includes a GPS unit that is compliant with one or more standards that govern the transmission of V2X wireless communications ("V2X communication" if singular, "V2X communications" if plural). For example, some V2X standards require that BSMs are transmitted at intervals by vehicles and that these BSMs must include within their payload GPS data having one or more attributes. In some embodiments, the standard-compliant GPS unit is an element of the sensor set 126.

An example of an attribute for GPS data is accuracy. In some embodiments, the standard-compliant GPS unit is operable to generate GPS measurements which are sufficiently accurate to describe the location of the ego vehicle 123 with lane-level accuracy. Lane-level accuracy is necessary to comply with some of the existing and emerging standards for V2X communication (e.g., C-V2X communication). Lane-level accuracy means that the GPS measurements are sufficiently accurate to describe which lane of a roadway that the ego vehicle 123 is traveling (e.g., the geographic position described by the GPS measurement is accurate to within 1.5 meters of the actual position of the ego vehicle 123 in the real-world). Lane-level accuracy is described in more detail below.

In some embodiments, the standard-compliant GPS unit is compliant with one or more standards governing V2X communications but does not provide GPS measurements that are lane-level accurate.

In some embodiments, the standard-compliant GPS unit includes any hardware and software necessary to make the ego vehicle 123 or the standard-compliant GPS unit compliant with one or more of the following standards governing V2X communications, including any derivative or fork thereof: EN 12253:2004 Dedicated Short-Range Communication—Physical layer using microwave at 5.8 GHz (review); EN 12795:2002 Dedicated Short-Range Communication (DSRC)— DSRC Data link layer: Medium Access and Logical Link Control (review); EN 12834:2002 Dedicated Short-Range Communication—Application layer (review); and EN 13372:2004 Dedicated Short-Range Communication (DSRC)— DSRC profiles for RTTT applications (review); EN ISO 14906:2004 Electronic Fee Collection—Application interface.

In some embodiments, the standard-compliant GPS unit is operable to provide GPS data describing the location of the ego vehicle 123 with lane-level accuracy. For example, the ego vehicle 123 is traveling in a lane of a multi-lane roadway. Lane-level accuracy means that the lane of the ego vehicle 123 is described by the GPS data so accurately that a precise lane of travel of the ego vehicle 123 may be accurately determined based on the GPS data for this ego vehicle 123 as provided by the standard-compliant GPS unit.

An example process for generating GPS data describing a geographic location of an object (e.g., a vehicle, a roadway object, an object of interest, a remote leading vehicle 124, a remote following vehicle 122, the ego vehicle 123, or some other tangible object or construct located in a roadway environment 140) is now described according to some embodiments. In some embodiments, the phantom system 199 include code and routines that are operable, when executed by the processor 125, to cause the processor to: analyze (1) GPS data describing the geographic location of the ego vehicle 123 and (2) ego sensor data describing the range separating the ego vehicle 123 from an object and a heading for this range; and determine, based on this analysis, GPS data describing the location of the object. In some embodiments, one or more of the first distance 415 and the third distance 440 are determined in this manner, a similar manner, or a derivative thereof. The GPS data describing the location of the object may also have lane-level accuracy because, for example, it is generated using accurate GPS data of the ego vehicle 123 and accurate sensor data describing information about the object.

In some embodiments, the standard-compliant GPS unit includes hardware that wirelessly communicates with a GPS satellite (or GPS server) to retrieve GPS data that describes the geographic location of the ego vehicle 123 with a precision that is compliant with a V2X standard. One example of a V2X standard is the DSRC standard. Other standards governing V2X communications are possible. The DSRC standard requires that GPS data be precise enough to infer if two vehicles (one of which is, for example, the ego vehicle 123) are located in adjacent lanes of travel on a roadway. In some embodiments, the standard-compliant GPS unit is operable to identify, monitor and track its two-dimensional position within 1.5 meters of its actual position 68% of the time under an open sky. Since roadway lanes are typically no less than 3 meters wide, whenever the two-dimensional error of the GPS data is less than 1.5 meters the phantom system 199 described herein may analyze the GPS data provided by the standard-compliant GPS unit and determine what lane the ego vehicle 123 is traveling in based on the relative positions of two or more different vehicles (one of which is, for example, the ego vehicle 123) traveling on a roadway at the same time.

In some embodiments, one or more of the first distance 415 and the third distance 440 are determined with a precision that is compliant with the DSRC standard (e.g., plus or minus 1.5 meters). These measurements improve the accuracy of the GUI 599 and the calculation of the second distance 435.

In some embodiments, the phantom system 199 determines the second distance 435 based on one or more of the following: the first distance 415 and the graphical placement of the leading vehicle 405 and the ego vehicle 425 in the GUI 599 as indicated by the first distance 415; the third distance 440 and the graphical placement of the ego vehicle 425 and the following vehicle 465 in the GUI 599 as indicated by the third distance 440; and the amount of free space remaining between the following vehicle 465 and the ego vehicle 425 as depicted in the GUI 599 without the inclusion of the phantom vehicle 445 (which may or may not be roughly equivalent to the third distance 440.

In some embodiments, the determination of one or more of these distances is included in the analysis data 181.

In some embodiments, considerations like screen size of the electronic display device, driver viewing angle of the electronic display device, driver gaze at the electronic display device, etc. factor into how the phantom system 199 determines the second distance 435. For example, the electronic display device reports its screen size to the phantom system, the sensor set of the ego vehicle 123 includes a camera pointed at the eyes of the driver, and one or more of the viewing angle and eye gaze of the driver relative to the screen of the electronic display device are measured by the camera; the phantom system then considers these variables when calculating the second distance 435 so that the representation of the phantom vehicle (size, color, brightness, etc.) is optimized for viewing by the driver of the ego vehicle.

In some embodiments, the GUI is displayed on an electronic display device of the ego vehicle 123. In some embodiments, the phantom system 199 is communicatively coupled to the electronic display to provide the GUI data 187 to the electronic display and control the operation of the electronic display to display the GUI. In some embodiments, the electronic display is a touchscreen that is also operated to receive inputs from the occupant of the ego vehicle 123. For example, the driver of the ego vehicle 123 touches the screen to confirm that they observed the phantom vehicle or to move the placement of the phantom vehicle (which is an example of user feedback provided to the phantom system for future use in determining the second distance 435).

By comparison to the standard-compliant GPS unit, a conventional GPS unit which is not compliant with the DSRC standard is unable to determine the location of a vehicle (e.g., the ego vehicle 123) with lane-level accuracy. For example, a typical roadway lane is approximately three meters wide. However, a conventional GPS unit only has an accuracy of plus or minus 10 meters relative to the actual location of the ego vehicle 123. As a result, such conventional GPS units are not sufficiently accurate to enable the phantom system 199 to determine the lane of travel of the ego vehicle 123. This measurement improves the accuracy of the GPS data describing the location of lanes used by the ego vehicle 123 when the phantom system 199 is providing its functionality.

In some embodiments, the memory 127 stores two types of GPS data. The first is GPS data of the ego vehicle 123 and the second is GPS data of one or more objects (e.g., the remote leading vehicle 124 or some other object in the roadway environment). The GPS data of the ego vehicle 123 is digital data that describes a geographic location of the ego vehicle 123. The GPS data of the objects is digital data that describes a geographic location of an object. One or more of these two types of GPS data may have lane-level accuracy.

In some embodiments, one or more of these two types of GPS data are described by the ego sensor data 195. For example, the standard-compliant GPS unit is a sensor included in the sensor set 126 and the GPS data is an example type of ego sensor data 195.

The communication unit 145 transmits and receives data to and from a network 105 or to another communication channel. In some embodiments, the communication unit 145 may include a DSRC transmitter, a DSRC receiver and other hardware or software necessary to make the ego vehicle 123 a DSRC-equipped device. In some embodiments, the phantom system 199 is operable to control all or some of the operation of the communication unit 145.

In some embodiments, the communication unit 145 includes a port for direct physical connection to the network 105 or to another communication channel. For example, the communication unit 145 includes a USB, SD, CAT-5, or similar port for wired communication with the network 105. In some embodiments, the communication unit 145 includes a wireless transceiver for exchanging data with the network 105 or other communication channels using one or more wireless communication methods, including: IEEE 802.11; IEEE 802.16, BLUETOOTH®; EN ISO 14906:2004 Electronic Fee Collection—Application interface EN 11253: 2004 Dedicated Short-Range Communication—Physical layer using microwave at 5.8 GHz (review); EN 12795:2002 Dedicated Short-Range Communication (DSRC)— DSRC Data link layer: Medium Access and Logical Link Control (review); EN 12834:2002 Dedicated Short-Range Communication—Application layer (review); EN 13372:2004 Dedicated Short-Range Communication (DSRC)— DSRC profiles for RTTT applications (review); the communication method described in U.S. patent application Ser. No. 14/471, 387 filed on Aug. 28, 2014 and entitled "Full-Duplex Coordination System"; or another suitable wireless communication method.

In some embodiments, the communication unit 145 includes a radio that is operable to transmit and receive V2X messages via the network 105. For example, the communication unit 145 includes a radio that is operable to transmit and receive any type of V2X communication described above for the network 105.

In some embodiments, the communication unit 145 includes a cellular communications transceiver for sending and receiving data over a cellular communications network including via short messaging service (SMS), multimedia messaging service (MMS), hypertext transfer protocol (HTTP), direct data connection, WAP, e-mail, or another suitable type of electronic communication. In some embodiments, the communication unit 145 includes a wired port and a wireless transceiver. The communication unit 145 also provides other conventional connections to the network 105 for distribution of files or media objects using standard network protocols including TCP/IP, HTTP, HTTPS, and SMTP, millimeter wave, DSRC, etc.

In some embodiments, the communication unit 145 includes a V2X radio. The V2X radio is a hardware unit that includes one or more transmitters and one or more receivers that is operable to send and receive any type of V2X message. In some embodiments, the V2X radio is a C-V2X radio that is operable to send and receive C-V2X messages. In some embodiments, the C-V2X radio is operable to send and receive C-V2X messages on the upper 30 MHz of the 5.9 GHz band (i.e., 5.895-5.925 GHz). In some embodiments, some or all of the wireless messages described above with reference to the method 300 depicted in FIG. 3 are transmitted by the C-V2X radio on the upper 30 MHz of the 5.9 GHz band (i.e., 5.895-5.925 GHz) as directed by the phantom system 199.

In some embodiments, the V2X radio includes a DSRC transmitter and a DSRC receiver. The DSRC transmitter is operable to transmit and broadcast DSRC messages over the 5.9 GHz band. The DSRC receiver is operable to receive DSRC messages over the 5.9 GHz band. In some embodiments, the DSRC transmitter and the DSRC receiver operate on some other band which is reserved exclusively for DSRC.

In some embodiments, the V2X radio includes a non-transitory memory which stores digital data that controls the frequency for broadcasting BSMs or CPMs. In some embodiments, the non-transitory memory stores a buffered version of the GPS data for the ego vehicle 123 so that the GPS data for the ego vehicle 123 is broadcast as an element of the BSMs or CPMs which are regularly broadcast by the V2X radio (e.g., at an interval of once every 0.10 seconds).

In some embodiments, the V2X radio includes any hardware or software which is necessary to make the ego vehicle 123 compliant with the DSRC standards or any other wireless communication standard that applies to wireless vehicular communications. In some embodiments, the standard-compliant GPS unit is an element of the V2X radio.

The memory 127 may include a non-transitory storage medium. The memory 127 may store instructions or data that may be executed by the processor 125. The instructions or data may include code for performing the techniques described herein. The memory 127 may be a dynamic random-access memory (DRAM) device, a static random-access memory (SRAM) device, flash memory, or some other memory device. In some embodiments, the memory 127 also includes a non-volatile memory or similar permanent storage device and media including a hard disk drive, a floppy disk drive, a CD-ROM device, a DVD-ROM device, a DVD-RAM device, a DVD-RW device, a flash memory device, or some other mass storage device for storing information on a more permanent basis.

In some embodiments, the memory 127 may store any or all of the digital data or information described herein.

As depicted in FIG. 1, the memory 127 stores the following digital data: the threshold data 196; the model data 171; the V2X data 133; the GPS data (as an element of the ego sensor data 195); the analysis data 181; the GUI data 187; the phantom data 173; the class data 174; the historical data 184; the remote sensor data 193; the roadway data 154; the ego sensor data 195; and the self data 155. The system data 129 includes some or all of this digital data. In some embodiments, the V2X messages (or C-V2X messages or the set of wireless messages) described herein are also stored in the memory 127. The above-described elements of the memory 127 were described above, and so, those descriptions will not be repeated here.

Some or all of this digital data can be organized in a data structure that is stored in the memory 127 in some embodiments.

In some embodiments, the ego vehicle 123 includes a vehicle control system 153. A vehicle control system 153 includes one or more ADAS systems or an autonomous driving system.

Examples of an ADAS system include one or more of the following elements of a vehicle: an adaptive cruise control ("ACC") system; an adaptive high beam system; an adaptive light control system; an automatic parking system; an automotive night vision system; a blind spot monitor; a collision avoidance system; a crosswind stabilization system; a driver drowsiness phantom system; a driver monitoring system; an emergency driver assistance system; a forward collision warning system; an intersection assistance system; an intelligent speed adaption system; a lane keep assistance ("LKA") system; a pedestrian protection system; a traffic sign recognition system; a turning assistant; and a wrong-way driving warning system. Other types of ADAS systems are possible. This list is illustrative and not exclusive.

An ADAS system is an onboard system that is operable to identify one or more factors (e.g., using one or more onboard vehicle sensors) affecting the ego vehicle 123 and modify (or control) the operation of its host vehicle (e.g., the ego vehicle 123) to respond to these identified factors. Described generally, ADAS system functionality includes the process of (1) identifying one or more factors affecting the ego vehicle and (2) modifying the operation of the ego vehicle, or some component of the ego vehicle, based on these identified factors.

For example, an ACC system installed and operational in an ego vehicle may identify that a subject vehicle being followed by the ego vehicle with the cruise control system engaged has increased or decreased its speed. The ACC system may modify the speed of the ego vehicle based on the change in speed of the subject vehicle, and the detection of this change in speed and the modification of the speed of the ego vehicle is an example the ADAS system functionality of the ADAS system.

Similarly, an ego vehicle 123 may have a LKA system installed and operational in an ego vehicle 123 may detect, using one or more external cameras of the ego vehicle 123, an event in which the ego vehicle 123 is near passing a center yellow line which indicates a division of one lane of travel from another lane of travel on a roadway. The LKA system may provide a notification to a driver of the ego vehicle 123 that this event has occurred (e.g., an audible noise or graphical display) or take action to prevent the ego vehicle 123 from actually passing the center yellow line such as making the steering wheel difficult to turn in a direction that would move the ego vehicle over the center yellow line or actually moving the steering wheel so that the ego vehicle 123 is further away from the center yellow line but still safely positioned in its lane of travel. The process of identifying the event and acting responsive to this event is an example of the ADAS system functionality provided by the LKA system.

The other ADAS systems described above each provide their own examples of ADAS system functionalities which are known in the art, and so, these examples of ADAS system functionality will not be repeated here.

In some embodiments, the ADAS system includes any software or hardware included in the vehicle that makes that vehicle be an autonomous vehicle or a semi-autonomous vehicle. In some embodiments, an autonomous driving system is a collection of ADAS systems which provides sufficient ADAS functionality to the ego vehicle 123 to render the ego vehicle 123 an autonomous or semi-autonomous vehicle.

An autonomous driving system includes a set of ADAS systems whose operation render sufficient autonomous functionality to render the ego vehicle 123 an autonomous vehicle (e.g., a Level III autonomous vehicle or higher as defined by the National Highway Traffic Safety Administration and the Society of Automotive Engineers).

In some embodiments, the phantom system 199 includes code and routines that are operable, when executed by the processor 125, to execute one or more steps of the example general method described herein. In some embodiments, the phantom system 199 includes code and routines that are operable, when executed by the processor 125, to execute one or more steps of the method 300 described below with reference to FIG. 3.

An example embodiment of the phantom system 199 is depicted in FIG. 2. This embodiment is described in more detail below.

In some embodiments, the phantom system 199 is an element of the onboard unit 139 or some other onboard vehicle computer. In some embodiments, the phantom system 199 includes code and routines that are stored in the memory 127 and executed by the processor 125 or the onboard unit 139. In some embodiments, the phantom system 199 is an element of an onboard unit of the ego vehicle 123 which executes the phantom system 199 and controls the operation of the communication unit 145 of the ego vehicle 123 based at least in part on the output from executing the phantom system 199.

In some embodiments, the phantom system 199 is implemented using hardware including a field-programmable gate array ("FPGA") or an application-specific integrated circuit ("ASIC"). In some other embodiments, the phantom system 199 is implemented using a combination of hardware and software.

The remote leading vehicle 124 includes elements and functionality which are similar to those described above for the ego vehicle 123, and so, those descriptions will not be repeated here. In some embodiments, the representation 505 depicted in FIG. 5 incudes a graphical representation of the remote leading vehicle 124. In some embodiments, the leading vehicle 405 is an example of the remote leading vehicle 124.

The remote following vehicle 122 includes elements and functionality which are similar to those described above for the ego vehicle 123, and so, those descriptions will not be repeated here. In some embodiments, the representation 565 depicted in FIG. 5 incudes a graphical representation of the remote following vehicle 122. In some embodiments, the following vehicle 465 is an example of the remote following vehicle 122.

The roadway environment 140 is now described according to some embodiments. In some embodiments, some, or all of the ego vehicle 123 and the remote leading vehicle 124 (or a plurality of remote vehicles) are located in a roadway environment 140. The roadway environment 140 is a portion of the real-world that includes a roadway, the ego vehicle 123, the remote leading vehicle 124, and the remote following vehicle 122. The roadway environment 140 may include other elements such as roadway signs, environmental conditions, traffic, etc. The roadway environment 140 includes some or all of the tangible and/or measurable qualities described above with reference to the ego sensor data 195 and the remote sensor data 193. The remote sensor data 193 includes digital data that describes the sensor measurements recorded by the sensor set 126 of the remote leading vehicle 124.

In some embodiments, the real-world includes the real of human experience comprising physical objects and excludes artificial environments and "virtual" worlds such as computer simulations. The phantom vehicle is not a portion of the real-word, and so, it is not included in the roadway environment 140.

In some embodiments, the roadway environment 140 includes a roadway device (e.g., a roadside unit or some other processor-based computing system) that in includes an edge server 198. In some embodiments, the edge server 198 is a connected processor-based computing device that includes an instance of the phantom system 199 and the other elements described above with reference to the ego vehicle 123 (e.g., a processor 125, a memory 127 storing the system data 129, a communication unit 145, etc.).

In some embodiments, the edge server 198 includes one or more of the following elements: a hardware server; a personal computer; a laptop; a device such as a roadside unit; or any other processor-based connected device that includes an instance of the phantom system 199 and a non-transitory memory that stores some or all of the digital data that is stored by the memory 127 of the ego vehicle 123 or otherwise described herein. For example, the memory 127 stores the system data 129. The system data 129 includes some or all of the digital data depicted in FIG. 1 as being stored by the memory 127.

In some embodiments, the edge server 198 includes a backbone network. In some embodiments, the edge server 198 is operable to provide any other functionality described herein. For example, the edge server 198 is operable to execute some or all of the steps of the methods described herein.

In some embodiments, the cloud server 103 one or more of the following: a hardware server; a personal computer; a laptop; a device such as a roadside unit; or any other processor-based connected device that includes an instance of the phantom system 199 and a non-transitory memory that stores some or all of the digital data that is stored by the memory 127 of the ego vehicle 123 or otherwise described herein.

In some embodiments, the cloud server 103 includes one or more of the following elements: an instance of the phantom system 199; and a non-transitory memory storing system data 129. The functionality of these elements was described above with reference to the ego vehicle 123 and the example general method, and so, those descriptions will not be repeated here.

In some embodiments, the cloud server 103 is operable to provide any other functionality described herein. For example, the cloud server 103 is operable to execute some or all of the steps of one or more of the methods described herein.

In some embodiments, the wireless messages described herein are encrypted themselves or transmitted via an encrypted communication provided by the network 105. In some embodiments, the network 105 may include an encrypted virtual private network tunnel ("VPN tunnel") that does not include any infrastructure components such as network towers, hardware servers or server farms. In some embodiments, the phantom system 199 includes encryption keys for encrypting wireless messages and decrypting the wireless messages described herein.

Referring now to FIG. 2, depicted is a block diagram illustrating an example computer system 200 including a phantom system 199 according to some embodiments.

In some embodiments, the computer system 200 may include a special-purpose computer system that is programmed to perform one or more of the following: one or more steps of one or more of the method 300 described herein with reference to FIG. 3 and the example general method described herein.

In some embodiments, the computer system 200 may include a processor-based computing device. For example, the computer system 200 may include an onboard vehicle computer system of the ego vehicle 123 or the remote leading vehicle 124.

The computer system 200 may include one or more of the following elements according to some examples: the phantom system 199; a processor 125; a communication unit 145; a vehicle control system 153; a storage 241; and a memory 127. The components of the computer system 200 are communicatively coupled by a bus 220.

In some embodiments, the computer system 200 includes additional elements such as those depicted in FIG. 1 as elements of the phantom system 199.

In the illustrated embodiment, the processor 125 is communicatively coupled to the bus 220 via a signal line 237. The communication unit 145 is communicatively coupled to the bus 220 via a signal line 246. The vehicle control system 153 is communicatively coupled to the bus 220 via a signal line 247. The storage 241 is communicatively coupled to the bus 220 via a signal line 242. The memory 127 is communicatively coupled to the bus 220 via a signal line 244. The sensor set 126 is communicatively coupled to the bus 220 via a signal line 248. The autonomous driving system 152 is communicatively coupled to the bus 220 via a signal line 243. The electronic display device 204 is communicatively coupled to the bus 220 via a signal line 235.

In some embodiments, the sensor set 126 includes standard-compliant GPS unit. In some embodiments, the communication unit 145 includes a network sniffer.

The following elements of the computer system 200 were described above with reference to FIG. 1, and so, these descriptions will not be repeated here: the processor 125; the communication unit 145; the vehicle control system 153; the memory 127; the sensor set 126; and the autonomous driving system 152.

The storage 241 can be a non-transitory storage medium that stores data for providing the functionality described herein. The storage 241 may be a DRAM device, a SRAM device, flash memory, or some other memory devices. In some embodiments, the storage 241 also includes a non-volatile memory or similar permanent storage device and media including a hard disk drive, a floppy disk drive, a CD-ROM device, a DVD-ROM device, a DVD-RAM device, a DVD-RW device, a flash memory device, or some other mass storage device for storing information on a more permanent basis.

In some embodiments, the phantom system 199 includes code and routines that are operable, when executed by the processor 125, to cause the processor 125 to execute one or more steps of the method 300 described herein with reference to FIG. 3. In some embodiments, the phantom system 199 includes code and routines that are operable, when executed by the processor 125, to cause the processor 125 to execute one or more steps of the example general method.

In the illustrated embodiment shown in FIG. 2, the phantom system 199 includes a communication module 202.

The communication module 202 can be software including routines for handling communications between the phantom system 199 and other components of the computer system 200. In some embodiments, the communication module 202 can be a set of instructions executable by the processor 125 to provide the functionality described below for handling communications between the phantom system 199 and other components of the computer system 200. In some embodiments, the communication module 202 can be stored in the memory 127 of the computer system 200 and can be accessible and executable by the processor 125. The communication module 202 may be adapted for cooperation and communication with the processor 125 and other components of the computer system 200 via signal line 222.

The communication module 202 sends and receives data, via the communication unit 145, to and from one or more elements of the operating environment 100.

In some embodiments, the communication module 202 receives data from components of the phantom system 199 and stores the data in one or more of the storage 241 and the memory 127.

In some embodiments, the communication module 202 may handle communications between components of the phantom system 199 or the computer system 200.

Referring now to FIG. 3, depicted is a flowchart of an example method 300 according to some embodiments. The method 300 includes step 305, step 310, and step 315 as depicted in FIG. 3. The steps of the method 300 may be executed in any order, and not necessarily those depicted in FIG. 3. In some embodiments, one or more of the steps are skipped or modified in ways that are described herein or known or otherwise determinable by those having ordinary skill in the art.

Example differences in technical effect between the methods described herein and the prior art are described below. These examples are illustrative and not exhaustive of the possible differences.

The existing solutions do not address the problem of detecting vehicles operated by "distracted" or otherwise unsafe drivers by providing the driver of an ego vehicle with a graphic (e.g., a phantom vehicle) that enables the driver to compare the driving of two different vehicles. Seeing this graphic (e.g., the GUI 599) makes the driver aware of the presence of an unsafe driver (which may or may not be themselves). For example, the GUI 599 depicted in FIG. 5 provides the driver of an ego vehicle with information that informs their subjective interpretation of the driving behavior of the following vehicle 465. In some embodiments, this assumes that the driver of the ego vehicle gets annoyed when the driving behavior of the representation 565 of following vehicle 465 is different from the driving behavior of the representation 525 of the ego vehicle 425 (which may or may not be indicated by the driving behavior of the phantom vehicle 445). So, the notification provided by the phantom system relies on "difference" instead of an absolute definition of "distractedness," which is hard or impossible to quantify.

In some embodiments, the phantom system is operable to project the representation of the phantom vehicle with a realistic time delay value to more closely match the behavior of the target vehicle (e.g., the vehicle whose behavior the phantom vehicle is intended to mimic). In some embodiments, a time delay value of zero or close to zero is implemented by the phantom system relative to the time when the sensor data describing the driving behavior of the target vehicle is recorded by the onboard sensor set.

The existing solutions also do not include an overlaid representation of a phantom vehicle along with the actual following vehicle to help the human driver of the ego vehicle to understand the deviation between the driving behaviors of the two vehicles intuitively as is done by the phantom system.

These examples are intended to be illustrative and not limiting.

Referring to FIG. 4, depicted is a block diagram illustrating an analysis 400 for determining how to generate a graphical user interface according to some embodiments. The analysis 400 uses the sensor data available to the phantom system to determine one or more of the following: the first distance 415 separating the leading vehicle 405 from the ego vehicle 425; the third distance 440 separating the ego vehicle 425 from the following vehicle 465; and the second distance 435 separating a depiction (or graphical representation) of the ego vehicle 425 from a phantom vehicle 445 which will be displayed in a GUI that is generated based on this analysis. An example of the GUI is depicted in FIG. 5. With reference to FIGS. 1 and 4, in some embodiments the ego vehicle 425 is an example of the ego vehicle 123, the leading vehicle 405 is an example of the remote leading vehicle 124, and the following vehicle 465 is an example of the remote following vehicle 122.

Referring to FIG. 5, depicted is a block diagram illustrating an example of a GUI 599 according to some embodiments. A "representation" includes a graphical image or a picture of an object. For example, the representation 505 includes a graphical image or a picture of the leading vehicle 405 as it exists in the real-word (or an idealized version of the same). The representation 525 includes a graphical image or a picture of the ego vehicle 425 as it exists in the real-word (or an idealized version of the same). The representation 565 includes a graphical image or a picture of the following vehicle 465 as it exists in the real-word (or an idealized version of the same). The phantom vehicle 445 is a graphical image or visual representation of a simulated vehicle. In other words, the phantom vehicle 445 is a simulated version of a real-world vehicle or a simulated representation of an imaginary vehicle. The GUI 599 is a graphical user interface that visually depicts the representations or graphical images described herein.

In the above description, for purposes of explanation, numerous specific details are set forth in order to provide a thorough understanding of the specification. It will be apparent, however, to one skilled in the art that the disclosure can be practiced without these specific details. In some instances, structures and devices are shown in block diagram form in order to avoid obscuring the description. For example, the present embodiments can be described above primarily with reference to user interfaces and particular hardware. However, the present embodiments can apply to any type of computer system that can receive data and commands, and any peripheral devices providing services.

Reference in the specification to "some embodiments" or "some instances" means that a particular feature, structure, or characteristic described in connection with the embodiments or instances can be included in at least one embodiment of the description. The appearances of the phrase "in some embodiments" in various places in the specification are not necessarily all referring to the same embodiments.

Some portions of the detailed descriptions that follow are presented in terms of algorithms and symbolic representations of operations on data bits within a computer memory. These algorithmic descriptions and representations are the means used by those skilled in the data processing arts to convey the substance of their work most effectively to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussion, it is appreciated that throughout the description, discussions utilizing terms including "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission, or display devices.

The present embodiments of the specification can also relate to an apparatus for performing the operations herein. This apparatus may be specially constructed for the required purposes, or it may include a general-purpose computer selectively activated or reconfigured by a computer program stored in the computer. Such a computer program may be stored in a computer-readable storage medium, including, but is not limited to, any type of disk including floppy disks, optical disks, CD-ROMs, and magnetic disks, read-only memories (ROMs), random access memories (RAMs), EPROMs, EEPROMs, magnetic or optical cards, flash memories including USB keys with non-volatile memory, or any type of media suitable for storing electronic instructions, each coupled to a computer system bus.

The specification can take the form of some entirely hardware embodiments, some entirely software embodiments or some embodiments containing both hardware and software elements. In some preferred embodiments, the specification is implemented in software, which includes, but is not limited to, firmware, resident software, microcode, etc.

Furthermore, the description can take the form of a computer program product accessible from a computer-usable or computer-readable medium providing program code for use by or in connection with a computer or any instruction execution system. For the purposes of this description, a computer-usable or computer-readable medium can be any apparatus that can contain, store, communicate, propagate, or transport the program for use by or in connection with the instruction execution system, apparatus, or device.

A phantom system suitable for storing or executing program code will include at least one processor coupled directly or indirectly to memory elements through a system bus. The memory elements can include local memory employed during actual execution of the program code, bulk storage, and cache memories which provide temporary storage of at least some program code in order to reduce the number of times code must be retrieved from bulk storage during execution.

Input/output or I/O devices (including, but not limited, to keyboards, displays, pointing devices, etc.) can be coupled to the system either directly or through intervening I/O controllers.

Network adapters may also be coupled to the system to enable the phantom system to become coupled to other phantom systems or remote printers or storage devices through intervening private or public networks. Modems, cable modem, and Ethernet cards are just a few of the currently available types of network adapters.

Finally, the algorithms and displays presented herein are not inherently related to any particular computer or other apparatus. Various general-purpose systems may be used with programs in accordance with the teachings herein, or it may prove convenient to construct more specialized apparatus to perform the required method steps. The required structure for a variety of these systems will appear from the description below. In addition, the specification is not described with reference to any particular programming language. It will be appreciated that a variety of programming languages may be used to implement the teachings of the specification as described herein.

The foregoing description of the embodiments of the specification has been presented for the purposes of illustration and description. It is not intended to be exhaustive or to limit the specification to the precise form disclosed. Many modifications and variations are possible in light of the above teaching. It is intended that the scope of the disclosure be limited not by this detailed description, but rather by the claims of this application. As will be understood by those familiar with the art, the specification may be embodied in other specific forms without departing from the spirit or essential characteristics thereof. Likewise, the particular naming and division of the modules, routines, features, attributes, methodologies, and other aspects are not mandatory or significant, and the mechanisms that implement the specification or its features may have different names, divisions, or formats. Furthermore, as will be apparent to one of ordinary skill in the relevant art, the modules, routines, features, attributes, methodologies, and other aspects of the disclosure can be implemented as software, hardware, firmware, or any combination of the three. Also, wherever a component, an example of which is a module, of the specification is implemented as software, the component can be implemented as a standalone program, as part of a larger program, as a plurality of separate programs, as a statically or dynamically linked library, as a kernel-loadable module, as a device driver, or in every and any other way known now or in the future to those of ordinary skill in the art of computer programming. Additionally, the disclosure is in no way limited to embodiment in any specific programming language, or for any specific operating system or environment. Accordingly, the disclosure is intended to be illustrative, but not limiting, of the scope of the specification, which is set forth in the following claims.

What is claimed is:

1. A method executed by an ego vehicle comprising:
generating, by a processor of the ego vehicle, a model of a driving behavior of a target vehicle based on sensor data describing the driving behavior and a roadway environment, wherein the driving behavior of the target vehicle is recorded by a sensor set of the ego vehicle with a location of the target vehicle being described with a lane-level accuracy and wherein the sensor set records a set of distances separating the target vehicle from one or more objects in the roadway environment;
determining a graphic of a phantom vehicle based on the model, wherein the graphic depicts a summary of the roadway environment including the phantom vehicle and the set of distances in the roadway environment including the location of the target vehicle with the lane-level accuracy; and
causing an electronic display of the ego vehicle to depict the graphic as an element of a graphical user interface that depicts the graphic and an image of a remote vehicle that is following the ego vehicle.

2. The method of claim 1, wherein the target vehicle is the ego vehicle and the graphic of the phantom vehicle depicts the driving behavior of the ego vehicle.

3. The method of claim 1, wherein the target vehicle is the remote vehicle and the graphic of the phantom vehicle depicts the driving behavior of the remote vehicle.

4. The method of claim 1, wherein the target vehicle is a simulated vehicle.

5. The method of claim 1, wherein the target vehicle is a historical vehicle whose driving behavior was recorded by the sensor set of the ego vehicle in a past.

6. The method of claim 1, wherein the electronic display includes a heads-up display unit.

7. The method of claim 1, wherein the electronic display is an element of an infotainment system.

8. The method of claim 1, wherein a second distance is determined based at least in part on a screen size of the electronic display.

9. The method of claim 1, wherein the graphic is displayed so that the graphic of the phantom vehicle is optimized for viewing by a driver of the ego vehicle.

10. The method of claim 1, wherein the graphic includes a graphical representation of the ego vehicle.

11. The method of claim 1, wherein the graphic does not include a picture of the ego vehicle.

12. The method of claim 1, wherein the graphic includes a picture of the ego vehicle.

13. The method of claim 1, wherein the image includes a graphical representation of the remote vehicle.

14. The method of claim 1, wherein the image does not include a picture of the remote vehicle.

15. The method of claim 1, wherein the image includes a picture of the remote vehicle.

16. The method of claim 1, wherein causing the electronic display to depict the graphic includes generating graphical data describing the graphical user interface including the graphic and the image and providing the graphical data to the electronic display to cause the electronic display to depict the graphical user interface including the graphic and the image.

17. The method of claim 1, wherein a time delay between recordation of the sensor data and depiction of the graphical user interface satisfies a threshold.

18. The method of claim 1, wherein a time delay between recordation of the sensor data and depiction of the graphical user interface is substantially zero seconds.

19. A system of an ego vehicle comprising:
a non-transitory memory; and
a processor communicatively coupled to the non-transitory memory, wherein the non-transitory memory stores computer readable code that is operable, when executed by the processor, to cause the processor to execute steps including:
generating a model of a driving behavior of a target vehicle based on sensor data describing the driving behavior and a roadway environment, wherein the driving behavior of the target vehicle is recorded by a sensor set of the ego vehicle with a location of the target vehicle being described with a lane-level accuracy and wherein the sensor set records a set of distances separating the target vehicle from one or more objects in the roadway environment;
determining a graphic of a phantom vehicle based on the model, wherein the graphic depicts a summary of the roadway environment including the phantom vehicle and the set of distances in the roadway environment including the location of the target vehicle with the lane-level accuracy; and
causing an electronic display of the ego vehicle to depict the graphic as an element of a graphical user interface that depicts the graphic and an image of a remote vehicle that is following the ego vehicle.

20. A computer program product of an ego vehicle including computer code stored on a non-transitory memory that is operable, when executed by a processor, to cause the processor to execute operations including:
generating a model of a driving behavior of a target vehicle based on sensor data describing the driving behavior and a roadway environment, wherein the driving behavior of the target vehicle is recorded by a sensor set of the ego vehicle with a location of the target vehicle being described with a lane-level accuracy and wherein the sensor set records a set of distances separating the target vehicle from one or more objects in the roadway environment;
determining a graphic of a phantom vehicle based on the model, wherein the graphic depicts a summary of the roadway environment including the phantom vehicle and the set of distances in the roadway environment including the location of the target vehicle with the lane-level accuracy; and causing an electronic display of the ego vehicle to depict the graphic as an element of a graphical user interface that depicts the graphic and an image of a remote vehicle that is following the ego vehicle.

\* \* \* \* \*